US006049235A

United States Patent [19]

Ichikawa et al.

[11] Patent Number: 6,049,235

[45] **Date of Patent: *Apr. 11, 2000**

[54] SEMICONDUCTOR DEVICE, SIGNAL PROCESSING SYSTEM USING THE SAME, AND CALCULATION METHOD THEREFOR

[75] Inventors: Takeshi Ichikawa, Hachioji; Mamoru Miyawaki, Isehara, both of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/595,657

[22] Filed: Feb. 2, 1996

[30] Foreign Application Priority Data

Feb. 2, 1995 [JP] Japan .................................... 7-016019

[51] Int. Cl.[7] .............................. G01R 19/00; H03F 3/45

[52] U.S. Cl. .............................................. 327/51; 327/355

[58] Field of Search ................................ 327/51, 52, 57, 327/65, 90, 91, 96, 99, 142, 337, 355, 359, 361, 382, 554

[56] References Cited

U.S. PATENT DOCUMENTS

| | | | |
|---|---|---|---|
| 4,446,438 | 5/1984 | Chang et al. | 327/554 |
| 4,584,568 | 4/1986 | Zomorrodi | 340/347 DA |
| 5,008,674 | 4/1991 | Da Franca et al. | 341/150 |
| 5,331,222 | 7/1994 | Lin et al. | 327/554 |
| 5,341,050 | 8/1994 | Mellissinos et al. | 327/91 |
| 5,428,237 | 6/1995 | Yuzurihara et al. | 257/349 |
| 5,466,961 | 11/1995 | Kikuchi et al. | 257/379 |
| 5,565,809 | 10/1996 | Shou et al. | 327/356 |

OTHER PUBLICATIONS

Chittenden et al, "Sampling control for analog waveform analyzer", IBM Technical Disclosure Bulletin, vol. 9, No. 6, Nov. 1996.

"An Economic Majority Logic IC Materialized by the CMOS", Nikkei Electronics, pp. 132–144, Nov. , 1973.

M. Yamashina et al., "A Microprogrammable Real–Time Video Signal Processor (VSP) for Motion Compensation", Journel of Solid–State Circuits, vol. 23, No. 4, pp. 907–915, Aug. 1988.

*Primary Examiner*—My-Trang Nu Ton

*Attorney, Agent, or Firm*—Fitzpatrick, Cella, Harper & Scinto

[57] ABSTRACT

There are provided a semiconductor device, in which one electrode of each capacitor is connected to multiple input terminals and the other electrodes of the capacitors are commonly connected to a sense amplifier, and which has an analog signal processing circuit arranged between at least one of the multiple input terminals for inputting signals to the capacitors and the capacitors, and a unit for resetting the commonly connected electrode sides of the capacitors, a signal processing system having a plurality of semiconductor devices each identical to the semiconductor device and performing signal processing, and a calculation method using the semiconductor device, whereby arithmetic operations of analog signals can be easily attained and high-speed processing and low consumption power can be achieved with a small circuit scale.

28 Claims, 13 Drawing Sheets

SEMICONDUCTOR DEVICE, SIGNAL PROCESSING SYSTEM USING THE SAME, AND CALCULATION METHOD THEREFOR

BACKGROUND OF THE INVENTION

1. Field of the Invention

The present invention relates to a semiconductor device, a signal processing system using the same, and a calculation method therefor and, more particularly, to a semiconductor device which can perform parallel calculation processing, a signal processing system using the same, and a calculation method therefor which can improve the calculation speed.

2. Related Background Art

In a semiconductor device that performs parallel calculation processing, since the circuit scale increases in progression as the number of signals to be subjected to parallel calculations increases, the manufacturing cost increases, and the yield is lowered. Due to an increase in delay amount of a signal transmitted via, e.g., wiring lines or due to an increase in the number of times of calculations in the circuit upon an increase in circuit scale, the operation speed decreases. In addition, the consumption power often increases considerably due to the calculation processing.

FIG. 1 shows an example of an absolute value calculation circuit as a kind of calculation processing. Referring to FIG. 1, the circuit comprises an A/D converter 101 for receiving analog signals A and B, subtracters 102-1 and 102-2 respectively receiving digital values of the signals A and B and outputting their differences, a selector 103 for selecting one of the outputs from the subtracters, and a comparator 104 for comparing the output from the selector 103 with a reference signal, and performs an absolute value calculation.

In this circuit, the analog signals A and B are A/D-converted into digital data by the A/D converter 101, and the digital data are then subjected to subtractions (SUB). At this time, the subtractions A−B and B−A are performed for the signals A and B, and thereafter, the selector (SEL) 103 extracts a signal with a positive sign (M. Yamashita et. al. IEEE JOURNAL OF SOLID-STATE CIRCUITS, VOL. 23 NO. 4 p. 907, 1988). Furthermore, in order to discriminate whether or not the extracted value is larger than a predetermined value C, the comparator 104 is connected to the selector.

However, when real-time processing of, e.g., dynamic images is to be performed, the number of calculation steps such as compression expansion, thin-out interpolation, DCT inverse DCT, quantization dequantization, and the like is very large. In addition, when the number of gradation levels increases to obtain images with higher reality, the number of bits increases, i.e., the circuit scale increases in progression, resulting in low processing speed.

SUMMARY OF THE INVENTION

The present invention has been made in consideration of the above-mentioned problems and has as its object to provide a semiconductor device which can attain a reduction of the circuit scale, an improvement in calculation speed, and a reduction of consumption power, a signal processing system using the same, and a calculation method therefor.

It is another object of the present invention to provide a semiconductor device which can constitute a circuit for performing parallel calculations for analog signals by a smaller number of transistors than those of a conventional logic circuit, can increase the calculation speed, and is suitable for power savings, a signal processing system using the same, and a calculation method therefor.

In particular, it is still another object of the present invention to provide a semiconductor device which can obtain a digital output signal as an absolute value comparison output or a magnitude comparison output with respect to an analog input signal since an analog signal processing circuit is arranged between multiple input terminals and capacitors in the semiconductor device constituted by the multiple input terminals, the capacitors connected to the multiple input terminals, and a sense amplifier to which the other terminals of the capacitors are commonly connected, and which is very effective for signal processing of image signals, audio signals, and the like since the processing circuit and processing method can be realized by MOS transistors which can easily attain a small circuit scale and low consumption power and can be integrated on a single chip, a signal processing system using the same, and a calculation method therefor.

Furthermore, it is still another object of the present invention to provide a semiconductor device which can constitute a circuit for performing parallel calculations by a smaller number of transistors than those of a conventional CMOS type logic circuit, and can attain high sensitivity with respect to a weak signal.

It is still another object of the present invention to attain a reduction of the circuit scale, an improvement in calculation speed, a reduction of consumption power, a reduction of the manufacturing cost, and an improvement in manufacturing yield upon application of the semiconductor device of the present invention to a semiconductor circuit, a correlation calculation circuit, and A/D and D/A converters, and to a signal processing system using these circuits.

Furthermore, it is still another object of the present invention to provide a semiconductor device in which one electrodes of capacitors are respectively connected to multiple input terminals and the other electrodes of the capacitors are commonly connected to a sense amplifier, comprising an analog signal processing circuit arranged between at least one of the multiple input terminals for inputting signals to the capacitors, and the capacitors, and an unit for resetting the commonly connected electrode side of the capacitors.

It is still another object of the present invention to provide a signal processing system which has a plurality of semiconductor devices each identical to the semiconductor device of the present invention, and outputs a signal in correspondence with the calculation results of the semiconductor devices.

In addition, it is still another object of the present invention to provide a calculation method using the semiconductor device, wherein a potential, at the input side to the capacitor connected to at least one of the multiple input terminals to which the analog signal processing circuit is connected, during a reset period has no correlation to a potential thereat during a sensing period.

It is still another object of the present invention to provide a calculation method for the semiconductor device, wherein at least one of switches connected to the commonly connected capacitors has an ON state period during the reset period of the commonly connected electrodes of the capacitors, at least one of the remaining switches connected to the commonly connected capacitors is set in an ON state after the former switch is set in an OFF state and the reset period ends, and a potential at the input side of the capacitor during the reset period has no correlation to a potential during a sensing period.

DETAILED DESCRIPTION OF THE PREFERRED EMBODIMENTS

Figure 1:
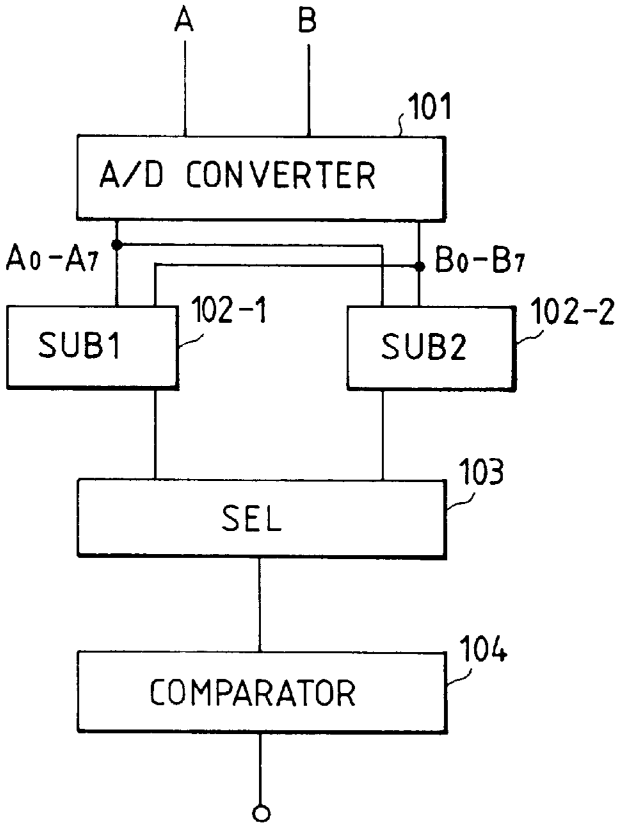
FIG. 1 PRIOR ART
FIG. 1 is a schematic block diagram of an absolute value calculation circuit having a function of converting analog signals into digital signals, and comparing the digital signals.

The present invention will be described below with reference to the accompanying drawings as needed.

A semiconductor device of the present invention can easily perform arithmetic operations of analog signals and can attain a small circuit scale, high-speed processing and low consumption power since one electrodes of capacitors are respectively connected to multiple input terminals, the other electrodes are commonly connected to a sense amplifier, an analog signal processing circuit is connected between at least one of the multiple input terminals connected to the capacitors, and the capacitors, and means for resetting the commonly connected electrode side of the capacitors is arranged.

Also, a semiconductor device of the present invention can easily perform arithmetic operations of analog signals and can attain a small circuit scale, high-speed processing, and low consumption power with a small circuit scale, since one electrodes of capacitors are respectively connected to multiple input terminals, the other electrodes are commonly connected to a sense amplifier, at least two of the multiple input terminals are connected to the commonly connected capacitors via switches, an analog signal processing circuit is connected between at least one of the multiple input terminals connected to the capacitors, and the capacitors, and means for resetting the commonly connected electrodes of the capacitors is arranged.

In the present invention, the capacitors, the sense amplifier, and the analog signal processing circuits are preferably arranged in a single chip.

In the present invention, the analog signal processing circuit may comprise a hold circuit.

In the present invention, the analog signal processing circuit may comprise an amplifier.

Furthermore, a semiconductor device of the present invention can perform an analog arithmetic operation with higher precision and can attain a small circuit scale, high-speed processing, and low consumption power, since the means for resetting the commonly connected electrodes of the capacitors comprises a MOSFET, and a structural body for inputting a pulse having a phase opposite to that of a pulse for driving the reset means is connected to the commonly connected electrodes.

In the present invention, the structural body for inputting the pulse having a phase opposite to that of the switch driving pulse is preferably connected between the switches and the capacitors.

According to the present invention, for example, a subtraction A−B can be performed for analog signals A and B.

Furthermore, according to the present invention, a plurality of semiconductor devices each identical to the above-mentioned semiconductor device are used, and an absolute value calculation $|A-B|<C$ can be performed for analog signals A and B.

Of course, the present invention can constitute a signal processing system using the above-mentioned semiconductor device.

In the present invention, the potential at the side, which is not commonly connected, of the capacitor connected to at least one of the multiple input terminals, during the reset period has no correlation to the potential thereat during the sensing period.

In the present invention, at least one of the switches connected to the commonly connected capacitors has an ON state period during the reset period of the commonly connected electrodes of the capacitors, at least one of the remaining switches connected to the commonly connected capacitors is set in an ON state after the former switch is set in an OFF state and the reset period ends, and the potential at the side, which is not commonly connected, of the capacitor, during the reset period has no correlation to the potential thereat during a sensing period.

The present invention will be described in more detail below with reference to its preferred embodiments.

First Embodiment

The first embodiment of the present invention will be described in detail below with reference to the block diagram in FIG. 2. In this embodiment, a preferred example of a circuit for performing a calculation for determining if analog signals A and B are smaller than a predetermined value δ ($A-B<\delta$) will be explained.

Figure 2:
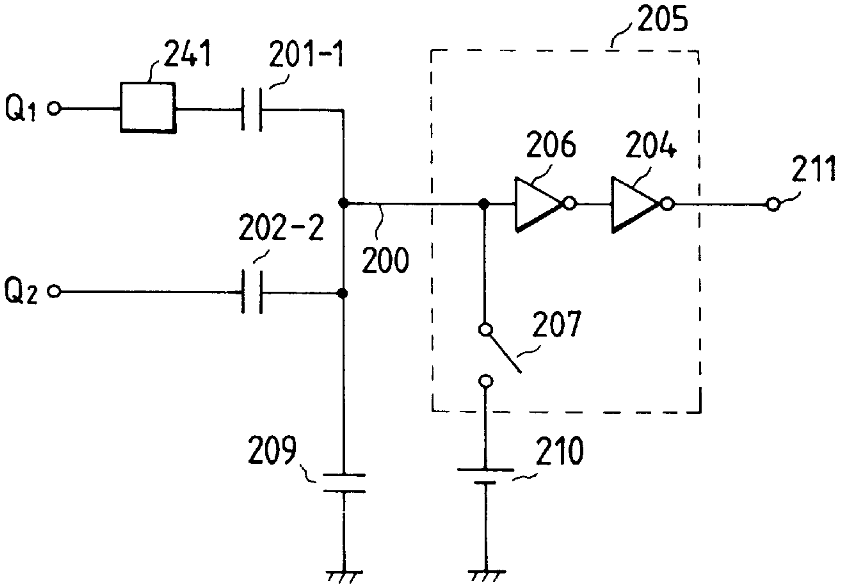
FIGS. 2, 5, 7, 8, and 9 are schematic circuit diagrams for explaining the respective embodiments of the present invention.

Referring to FIG. 2, the circuit has input terminals Q1 and Q2. Therefore, the circuit in FIG. 2 has two multiple input terminals. The circuit also has capacitors 201-1 and 202-2 which may or may not have the same value of capacitance. The circuit further has a sense amplifier 205, a first inverter 206 in the sense amplifier, a second inverter 204 in the sense amplifier, a reset switch 207 for resetting the inverters, a reset power supply 210, an output terminal 211, and a capacitance 209 including a parasitic capacitance formed at commonly connected, one terminal 200 of the capacitors 201-1 and 202-2. An amplifier 241 for amplifying an analog signal voltage is connected as an analog circuit between the input terminal Q1 and the capacitor 201-1.

The operation of this embodiment will be explained below. An analog signal is input to the input terminal Q1. This signal is amplified to a value B (V) via the amplifier 241, and is then input to the capacitor 201-1. On the other hand, a predetermined value δ is input to the input terminal Q2. In this state, the reset switch 207 is turned on to reset the commonly connected capacitor terminal 200 to V0 (e.g., 2.5 (V)). Subsequently, after the reset switch 207 is turned off, signals are respectively input to the input terminals Q1 and Q2. The signal input to the input terminal Q1 is amplified to a value A (V) via the amplifier, while the value of the signal input to the input terminal Q2 remains the same (0 (V)). These signals are respectively input to the capacitors 201-1 and 202-2. At this time, a potential V1 of the sense amplifier input portion assumes a value determined by the following equations:

$$C1(V0-B)+C2(V0-\delta)+Cz\cdot V0=C1(V1-A)+C2\cdot V1+Cz\cdot V1$$

$$\begin{aligned} V1 &= V0+\{C1(A-B)-C2\cdot\delta\}/(C1+C2+Cz) \\ &= V0+\{C1(A-B-(C2/C1)\delta)\}/(C1+C2+Cz) \end{aligned}$$

where Cz is the parasitic capacitance or the like formed at the terminal 200.

If C1=C2 is set for the sake of simplicity, we have:

$$V1=V0+(A-B-\delta)C1/\Sigma Ci$$

for ΣCi=C1+C2+Cz

If V0 is assumed to be the logic inversion potential of the inverter 206 at the input terminal side of the sense amplifier, the inverter outputs an inverted output if the value (A−B−δ) is positive; otherwise, it outputs a non-inverted output. After all, in correspondence with a change in potential input to the input terminal side of each capacitor, a HIGH-LEVEL digital signal is output to the output terminal 211 of the sense amplifier when A−B>δ; a LOW-LEVEL digital signal when A−B<δ. At this time, a potential B during the reset period has no specific correlation to a potential A during the sensing period. Therefore, an arbitrary value can be calculated as an analog signal.

In this embodiment, signals input to the two multiple input terminals have been exemplified. With the above-mentioned arrangement, a circuit for performing high-speed parallel calculations and digital conversion of signals including analog signals can be constituted. More specifically, a conventional analog circuit adopts a method of outputting a value obtained by performing analog processing of an input analog signal, or a method of temporarily converting an analog signal into a digital signal (A/D converter), and thereafter, calculating and outputting the digital signal (this applies to the above-mentioned prior art), while according to the present invention, calculations and digital conversion of an input analog signal can be attained by a single circuit.

For this reason, the circuit of the present invention can be constituted by a smaller number of transistors than those in a conventional logic circuit, and is suitable for high-speed processing and power savings. As a semiconductor circuit, all the circuit components shown in FIG. 2 including an analog processing device are preferably integrated on a single chip, needless to say. Integration of the circuit components on the single chip can attain a further size reduction, high-speed processing, and low consumption power of the chip.

The analog signal processing circuit is not limited to a specific circuit but may be arbitrary circuits including, e.g., an amplifier, a hold circuit, a sample & hold circuit, a buffer, a sensor, a D/A or A/D converter, and the like.

Furthermore, this embodiment exemplifies a two-input/two-capacitor circuit. However, needless to say, the present invention is not limited to this circuit. For example, when five input signals are supplied to multiple input terminals, a multiple-input calculation like (A+B−C−D−E) can be similarly realized.

Figure 3:
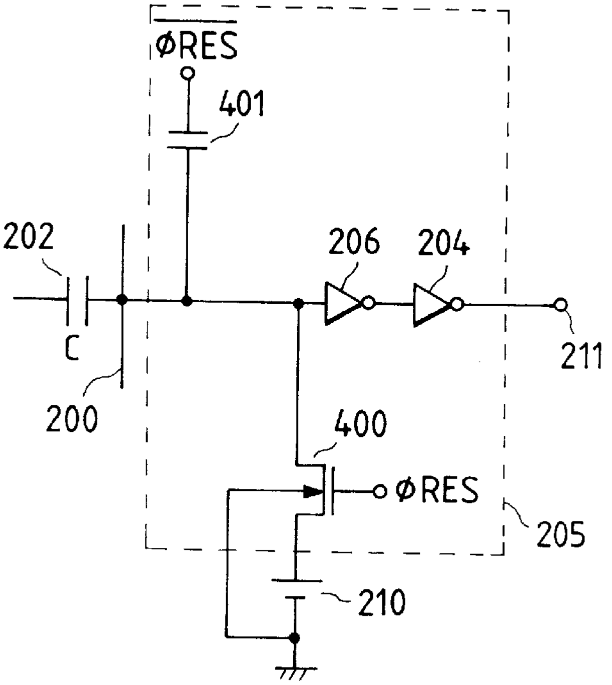
FIGS. 3 and 4 are schematic circuit diagrams for explaining an example of a peripheral circuit including a sense amplifier according to the respective embodiments of the present invention.

The means for resetting the commonly connected capacitor terminal 200 will be described in detail below with reference to FIG. 3. FIG. 3 is a circuit diagram showing an example of a circuit from a capacitance C (202) to the sense amplifier output via the commonly connected terminal 200 in FIG. 2. In FIG. 3, an NMOS transistor 400 is used as means for resetting the commonly connected terminal 200 by the reset power supply 210. A driving pulse ϕRES for resetting the terminal is input to the gate of the NMOS transistor. Since this circuit uses the NMOS transistor, the commonly connected terminal 200 is reset by the power supply 210 during the HIGH-LEVEL period of the driving signal pulse ϕRES, and thereafter, the NMOS transistor is turned off by setting the signal pulse ϕRES at LOW LEVEL, thereby setting the commonly connected terminal 200 in a floating state.

On the other hand, a connection is preferably made to input a pulse $\overline{\phi RES}$ having a phase opposite to that of the signal pulse ϕRES to the terminal 200 via a capacitor 401, since a change in voltage at the commonly connected terminal 200 due to capacitive division between the combined capacitance of the gate and drain (at the commonly connected terminal 200 side) of the transistor and the capacitance 209, which is generated when the signal pulse ϕRES turns off the MOS transistor, can be canceled, and the commonly connected terminal can be reset to the potential of the reset power supply 210 with higher precision. For example, when the voltage of the commonly connected terminal is set to be a value in the neighborhood of the logic inversion voltage of the inverter 206, as the value draws nearer the logic inversion voltage of the inverter 206, an output signal can be generated in response to a change in weak signal generated at the commonly connected terminal, i.e., the sensitivity can be improved. Thus, a short response time can be attained, and hence, this arrangement contributes to low consumption power.

The value of the capacitor 401 as a structural body used in this circuit is preferably set to be close to the value of the gate-drain combined capacitance of the NMOS transistor as much as possible since the commonly connected terminal can then be reset to a potential close to that of the power supply 210. However, the present invention is not limited to this. For example, even when the capacitor 401 has a value different from (e.g., half) that of the combined capacitance, a remarkable effect can be expected.

Figure 4:
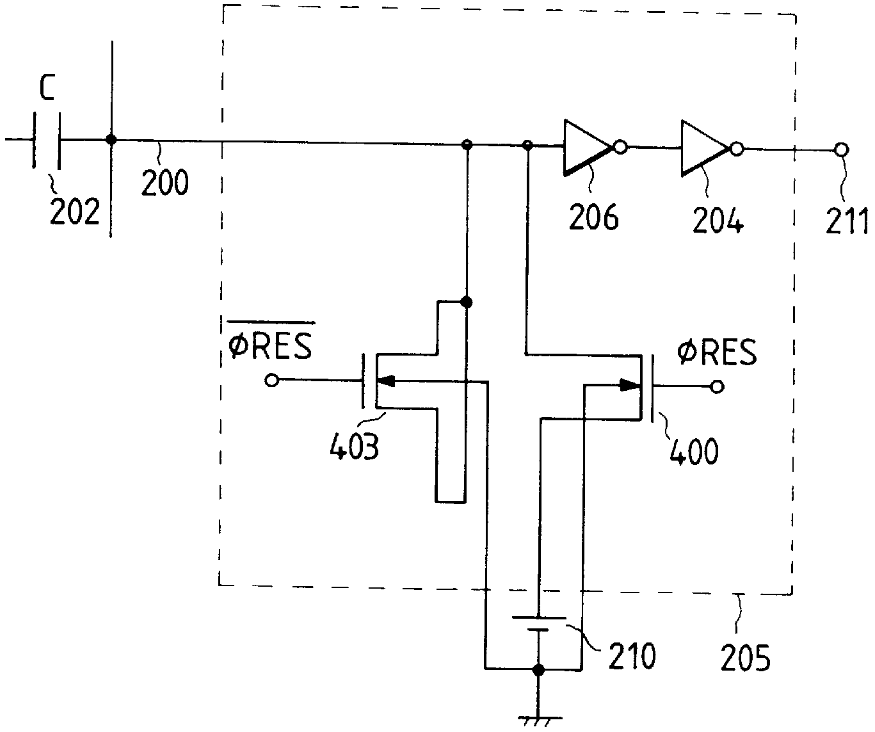

FIG. 4 is a schematic circuit diagram for explaining another example of the circuit arrangement shown in FIG. 3. In FIG. 4, the drain and source of an NMOS transistor 403 are commonly connected to the terminal 200 to which the capacitors are commonly connected. The capacitance of the NMOS transistor 400 is mainly determined by the combined capacitance of the gate and drain (at the commonly connected terminal 200 side) of the transistor. This capacitance is a quantity which depends on the impurity amount of the source/drain, the thermal history upon formation of the transistor, and the like. For this reason, it is difficult to accurately design and form the capacitance, and this capacitance also has gate voltage dependence. The NMOS transistor 403, which is assumed to have the same capacitance as that of the NMOS transistor 400 as well as the voltage dependence, is a structural body shown in FIG. 4. The capacitance of the NMOS transistor 403 as the structural body can be assumed to be roughly equal to that of the NMOS transistor 400. In the example shown in FIG. 4, one reset means and one NMOS transistor 403 as the structural body applied with the opposite phase pulse are connected. However, the present invention is not limited to this. For example, the present invention may be applied to a case wherein the reset means and the structural body (the NMOS transistor 403 in the above example) applied with the opposite phase pulse respectively comprise PMOS transistors or a plurality of reset means and structural bodies are connected, or a structural body in which both NMOS and PMOS transistors are used as the reset means and the opposite phase pulses are applied to these transistors. In addition, the reset means may comprise an NMOS transistor and the structural body applied with the opposite phase pulse may comprise a PMOS transistor, or vice versa.

Second Embodiment

Figure 5:
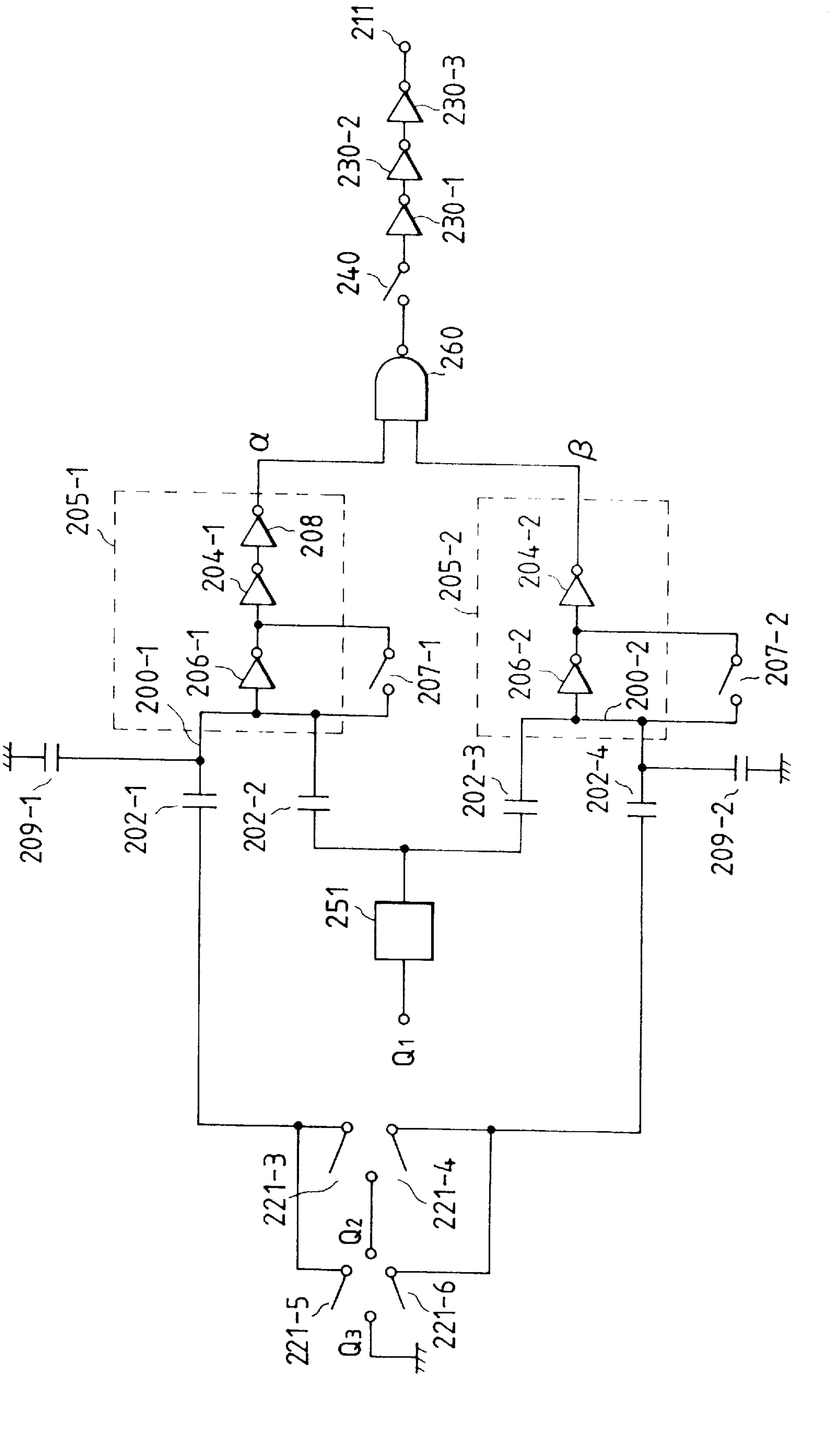

FIG. 5 is a schematic circuit diagram for explaining the second embodiment of the present invention. In this embodiment, a preferred example of a circuit for performing a calculation for determining if analog signals A and B are smaller than a predetermined value δ (|A−B|<δ) will be described.

In FIG. 5, the circuit has input terminals Q1 to Q3. Therefore, FIG. 5 shows a multiple-input circuit having three input terminals. In this embodiment, the input terminal Q3 is connected to ground. In this embodiment, the voltage at the input terminal Q3 is 0 V. The circuit also has switches 221-3 to 221-6. The circuit further has capacitors 202-1 to 202-4, which may or may not have a common capacitance. Moreover, the circuit has sense amplifiers 205-1 and 205-2, inverters 206-1 and 206-2 in the sense amplifiers, second inverters 204-1 and 204-2 in the sense amplifiers 205-1 and 205-2, a third inverter 208 in the sense amplifier 205-1, reset switches 207-1 and 207-2 for respectively resetting the inverters 206-1 and 206-2, an output terminal 211, and capacitances 209-1 and 209-2 which include parasitic capacitances formed at commonly connected terminals 200-1 and 200-2 between the capacitors 202-1 and 202-2, and between the 202-3 and 202-4. In addition, the circuit has inverters 230-1 to 230-3, a NAND circuit 260, and a switch 240. A voltage amplifier 251 for amplifying an analog signal voltage input to the input terminal Q1 is connected between the input terminal Q1 and the capacitors 202-2 and 202-3.

The operation of this embodiment will be described below. When an analog signal is input to the input terminal Q1, the voltage amplifier 251 outputs a signal having a value B (V) (amplified value). On the other hand, a predetermined value δ is input to the input terminal Q2. The input terminal Q3 is set to be 0 (V), as described above. The switches 221-3 and 221-6 are set in an ON state, and in this state, the reset switches 207-1 and 207-2 are turned on to reset the commonly connected capacitor terminals 200-1 and 200-2 to V0. In FIG. 5, the inverters 206-1 and 206-2 comprise chopper type CMOS inverters, and the commonly connected terminals are reset to the logic inversion voltages. Subsequently, the switches 221-3 and 221-6 and the reset switches 207-1 and 207-2 are turned off, and a signal is input to the input terminal Q1. The amplifier 251 outputs this signal as a signal having a value A (V) (amplified value). On the other hand, the switches 221-4 and 221-5 are set in an ON state. At this time, potentials V1 and V1' of input portions 200-1 and 200-2 of the sense amplifiers 205-1 and 205-2 have values determined by the following equations:

$$C1(V0-B)+C2(V0-\delta)+Cz\cdot V0=C1(V1-A)+C2\cdot V1+Cz\cdot V1$$

$$\begin{aligned} V1 &= V0+\{C1(A-B)-C2\cdot\delta\}/(C1+C2+Cz) \\ &= V0+\{C1(A-B-(C2/C1)\delta\}/(C1+C2+Cz) \end{aligned}$$

where Cz is the capacitance value of the parasitic capacitance of each of the commonly connected terminals 200-1 and 200-2.

If C1=C2 is set for the sake of simplicity, we have:

$$V1=V0+(A-B-\delta)C1/\Sigma Ci$$

On the other hand, $$C1(V0-B)+C2\cdot V0+Cz\cdot V0=C1(V1'-A)+C2(V1'-\delta)+Cz\cdot V1'$$

$$\begin{aligned} V1' &= V0+\{C1(A-B)+C2\cdot\delta)\}/(C1+C2+Cz) \\ &= V0+\{C1(A-B+(C2/C1)\delta\}/(C1+C2+Cz) \end{aligned}$$

If C1=C2 is set for the sake of simplicity, we have:

$$V1'=V0+(A-B+\delta)C1/\Sigma Ci$$

Figure 6A:
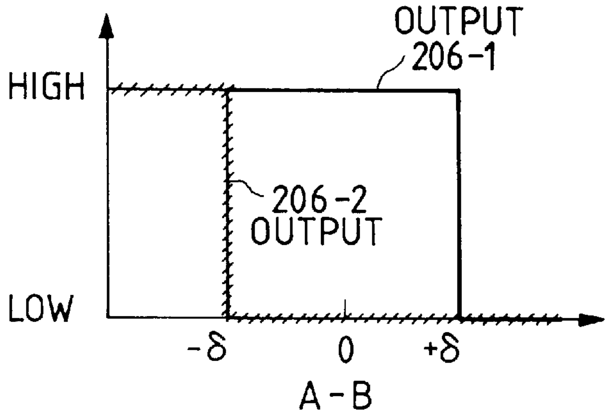
FIGS. 6A to 6D are schematic timing charts for explaining the driving timings according to the embodiment of the present invention.
Figure 6B:
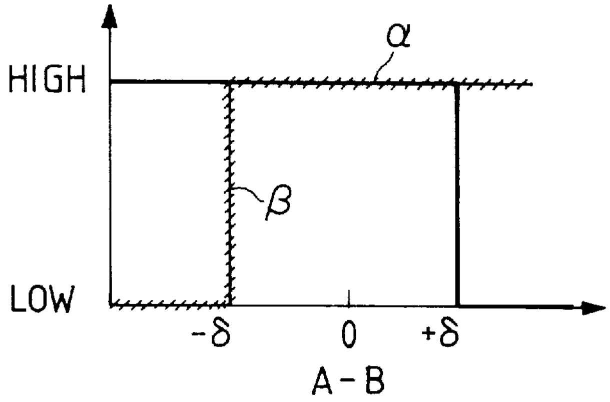
Figure 6C:
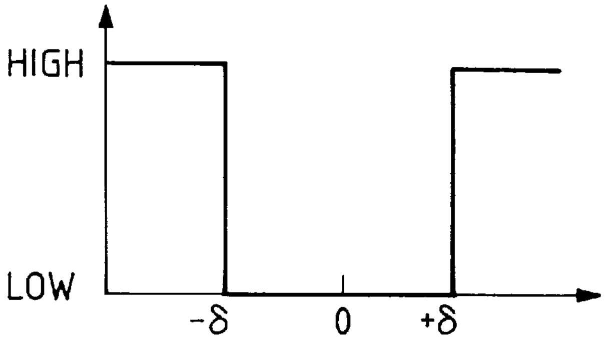
Figure 6D:
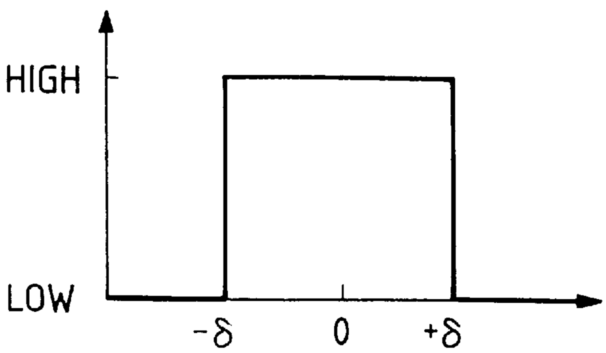

Since V0 is the logic inversion potential of each of the inverters 206-1 and 206-2 at the input terminals of the sense amplifiers 205-1 and 205-2, each inverter outputs an inverted output if a value (A−B−δ) or (A−B+δ) is positive; otherwise, it outputs a non-inverted output (FIG. 6A). After all, in correspondence with a change in potential input to the input terminal side of each capacitor, a HIGH-LEVEL signal is output to an output terminal a of the sense amplifier 205-1 when A−B>δ; a LOW-level signal is output thereto when A−B<δ, and a HIGH-LEVEL signal is output to an output terminal β of the sense amplifier 205-2 when A−B>−δ; a LOW-level signal is output thereto when A−B<−δ (FIG. 6B). Therefore, an output obtained via the NAND circuit 260 has characteristics shown in FIG. 6C, and at the output terminal via the inverters 230-1 to 230-3, an absolute value calculation circuit, which outputs a HIGH-LEVEL signal when |A−B|<δ (FIG. 6D); outputs a LOW-LEVEL signal when |A−B|>δ (FIG. 6D), is realized. As can be seen from the schematic circuit diagram in FIG. 5, the number of transistors can be very small. With the above-mentioned arrangement, a circuit which performs high-speed parallel calculations of signals including analog signals can be constituted. Needless to say, this circuit has a smaller number of transistors than those of a conventional logic circuit, and is suitable for power savings as well as high-speed processing. For example, assuming that an absolute value calculation |A−B|<δ is performed at 256 gradation levels (8 bits) in the CMOS arrangement described in the paragraphs of the prior art, a circuit including a large number of transistors such as an 8-bit A/D converter, two 8-bit subtracters (A−B and B−A), a selector, and an 8-bit comparator, as shown in FIG. 1, is required. However, according to the circuit of this embodiment, an absolute value calculation with detection precision of 20 mV or less if the power supply voltage is 5 V, i.e., a precision corresponding to 256 gradation levels, can be realized by the circuit having a very small number of transistors, i.e., the multiple input terminals, the capacitors, the sense amplifiers, the NAND circuit, and the inverters, as shown in FIG. 5.

Third Embodiment

The third embodiment of the present invention will be described in detail below with reference to the schematic circuit diagram in FIG. 7. In this embodiment, a preferred example of a circuit for performing a calculation for determining if analog signals A and B are smaller than a predetermined value δ (A−B<δ) will be described.

Figure 7:
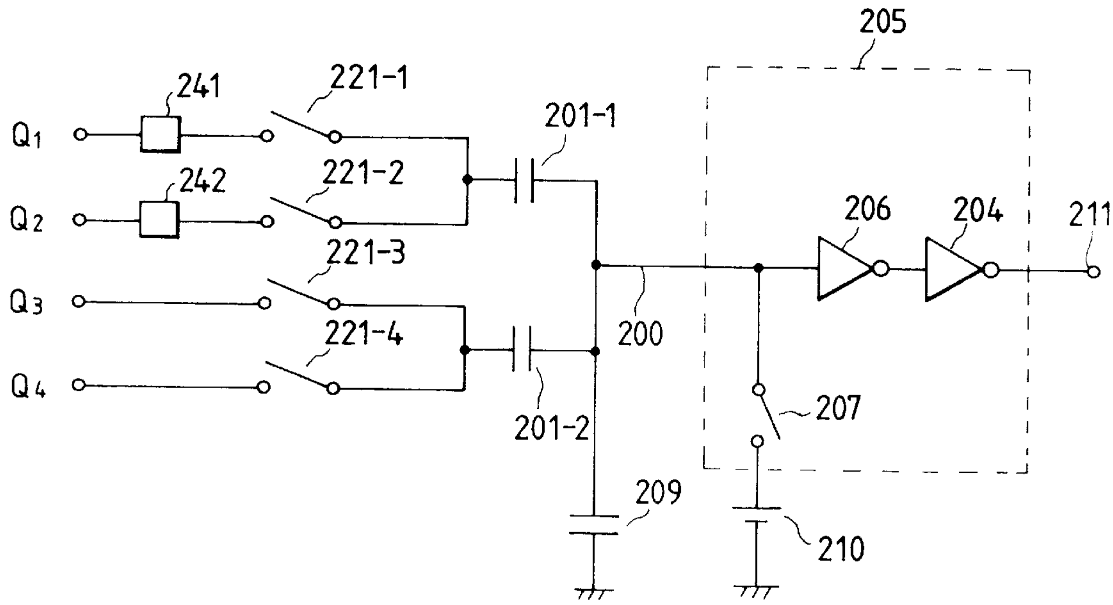

In FIG. 7, the circuit has input terminals Q1 to Q4. In this embodiment, a multiple-input circuit having four input terminals will be exemplified. The circuit also has switches 221-1 to 221-4. The circuit further has capacitors 201-1 and 201-2, which may or may not have a common capacitance. Also, the circuit has a sense amplifier 205, an inverter 206 in the sense amplifier 205, a second inverter 204 in the sense amplifier 205, a reset switch 207 for resetting the input terminal of the inverter 206 and a commonly connected terminal 200, a reset power supply 210, an output terminal 211 of the sense amplifier 205, and a capacitance 209 including a parasitic capacitance formed at the commonly connected terminal 200 of the capacitors 201. Amplifiers 241 and 242 for amplifying analog signal voltages are respectively connected between the input terminals Q1 and Q2, and the switches.

The operation of this embodiment will be described below. An analog signal is input to the input terminal Q1. The input signal is amplified by the amplifier 241, and is output as a signal having a value B (V) (amplified value). On the other hand, a predetermined value δ is input to the input terminal Q3. The input terminals Q2 and Q4 may have arbitrary inputs. The switches 221-1 and 221-3 are set in an ON state, and in this state, the commonly connected capacitor terminal 200 is reset to V0 (e.g., 2.5 (V)). Subsequently, the switches 221-1 and 221-3, and the reset switch 207 are turned off, and signals are respectively input to the input terminals Q2 and Q4. The signal input to the input terminal Q2 is amplified by the amplifier 242, and is then output. On the other hand, a signal of 0 (V) is input to the input terminal Q4, and the switches 221-2 and 221-4 are set in an ON state. A structural body for inputting a pulse having a phase opposite to that of a switch driving pulse is preferably connected to the commonly connected capacitor terminal between these switches 221-1 to 221-4 and the reset switch 207, as in the first embodiment. When the above-mentioned structural body is connected, a change in voltage caused by the capacitance of the gate and drain generated when the switch driving pulse is turned off can be reduced, thus further improving the precision of the sense system, and allowing higher-speed detection.

At this time, a potential V1 at the input portion of the sense amplifier 205 has a value determined by the following equations:

$$C1(V0-B)+C2(V0-\delta)+Cz\cdot V0=C1(V1-A)+C2\cdot V1+Cz\cdot V1$$

$$V1=V0+\{C1(A-B)-C2\cdot\delta\}/(C1+C2+Cz)$$
$$=V0+\{C1(A-B)-(C2/C1)\delta\}/(C1+C2+Cz)$$

where Cz is the capacitance value including the parasitic capacitance at the commonly connected terminal 200.

If C1=C2 is set for the sake of simplicity, V1 can be expressed by:

$$V1=V0+(A-B-\delta)C1/\Sigma Ci$$

for ΣCi=C1+C2+Cz

If the reset voltage V0 is assumed to be the logic inversion potential of the inverter 206 at the input terminal side of the sense amplifier 205, the inverter outputs an inverted output if the value (A−B−δ) is positive; otherwise, it outputs a non-inverted output. After all, in correspondence with a change in potential input to the input terminal side of each capacitor, a HIGH-LEVEL digital signal is output to the output terminal 211 of the sense amplifier 205 when A−B>δ; a LOW-LEVEL digital signal when A−B<δ. With the above-mentioned arrangement, a circuit which performs high-speed parallel calculations can be constituted. This circuit can be constituted by a smaller number of transistors than those of a conventional logic circuit, and is suitable for power savings as well as high-speed processing. In this embodiment, a 4-input/2-capacitor circuit has been exemplified. Of course, the present invention is not limited to this.

Fourth Embodiment

The fourth embodiment of the present invention will be described in detail below with reference to the schematic circuit diagram shown in FIG. 8. In this embodiment, a preferred example of a circuit for performing a calculation for determining if analog signals A and B are smaller than a predetermined value δ (|A−B|<δ) will be described.

Figure 8:
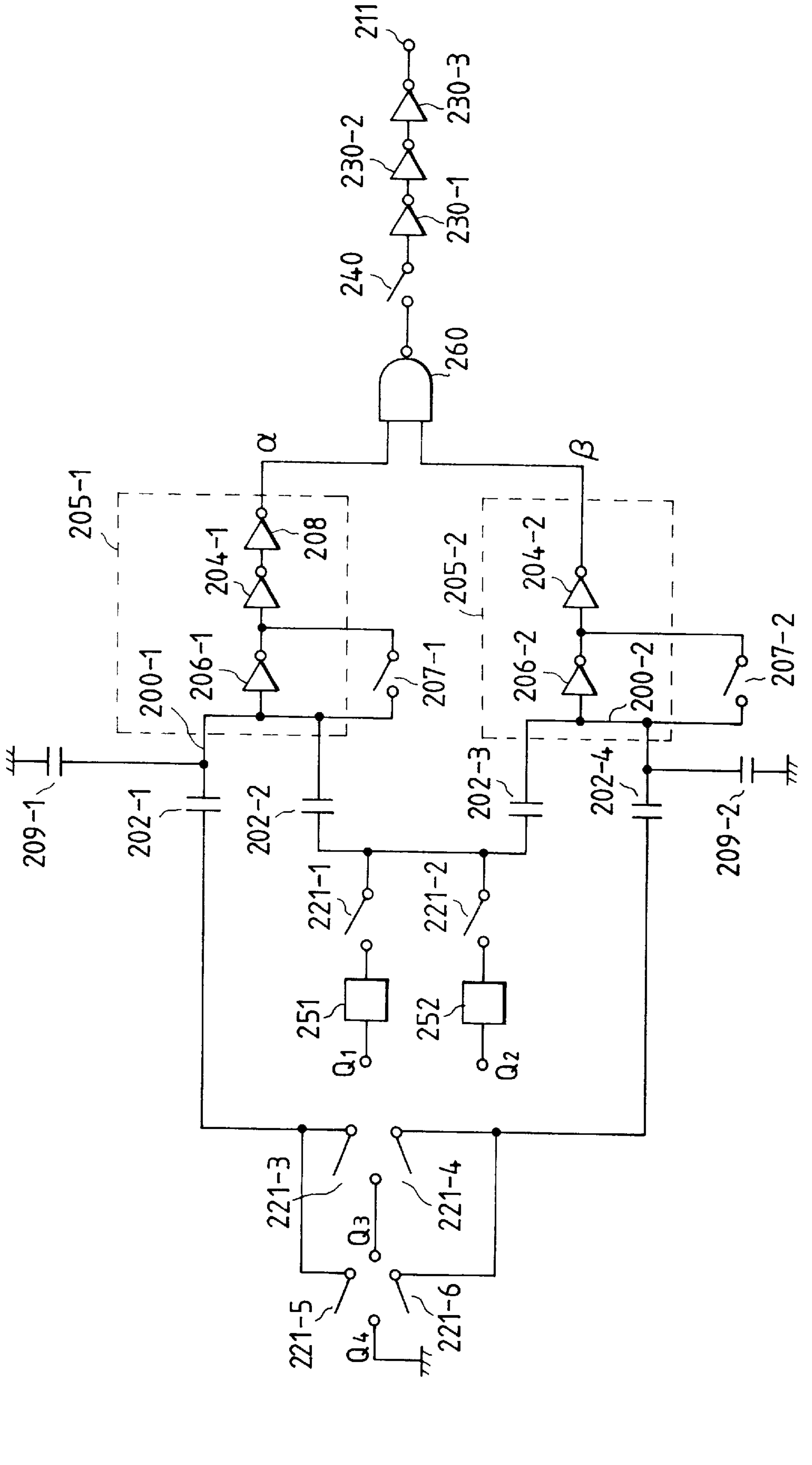

In FIG. 8, the circuit has input terminals Q1 to Q4. FIG. 8 shows a multiple-input circuit having four input terminals. Note that the input terminal Q4 is connected to ground (the input voltage to the input terminal Q4 is set to be 0 V). The circuit also has switches 221-1 to 221-6. The circuit further has capacitors 202-1 to 202-4, which may or may not have a common capacitance. Also, the circuit has sense amplifiers 205-1 and 205-2, inverters 206-1 and 206-2 in the sense amplifiers 205-1 and 205-2, second inverters 204-1 and 204-2 in the sense amplifiers 205-1 and 205-2, a third inverter 208 in the sense amplifier 205-1, reset switches 207-1 and 207-2 for resetting the input sides of the inverters and commonly connected terminals 200-1 and 200-2 of the capacitors, an output terminal 211, and capacitances 209-1 and 209-2 including parasitic capacitances formed at the commonly connected terminals 200-1 and 200-2 between the capacitors 202-1 and 202-2, and between the capacitors 202-3 and 202-4. Moreover, the circuit has inverters 230-1 to 230-3, a NAND circuit 260, and a switch 240. Voltage amplifiers 251 and 252 for respectively amplifying analog signal voltages are connected between the input terminal Q1 and the switch 221-1 and between the input terminal Q2 and the switch 221-2.

The operation of this embodiment will be described below. An analog signal is input to the input terminal Q1. The input signal is amplified by the voltage amplifier 251, and is output as a signal having a value B (V) (amplified value). On the other hand, a predetermined value δ is input to the input terminal Q3. The input terminal Q4 is set to be 0 (V). At this time, the input terminal Q2 is arbitrarily set. The switches 221-1, 221-3, and 221-6 are set in an ON state, and in this state, the commonly connected capacitor terminals 200-1 and 200-2 are reset to V0. In FIG. 8, the inverters 206-1 and 206-2 comprise chopper type CMOS inverters, and the commonly connected terminals are reset to the logic inversion voltages by turning on the reset switches 207-1 and 207-2. Subsequently, the switches 221-1, 221-3, and 221-6, and the reset switch 207 are turned off, and an analog signal is input to the input terminal Q2. The input signal is amplified by the voltage amplifier 252, and is output as a signal having a value A (V) (amplified value). In addition, the switches 221-2, 221-4, and 221-5 are set in an ON state. At this time, if C1=C2 as in the second embodiment, potentials V1 and V1' of the input portions 200-1 and 200-2 of the sense amplifiers have the following values:

$$V1=V0+(A-B-\delta)C1/\Sigma Ci$$

$$V1'=V0+(A-B+\delta)C1/\Sigma Ci$$

As in the second embodiment, at the output terminal 211, an absolute value calculation circuit which outputs a HIGH-LEVEL signal when $|A-B|<\delta$ is realized. As can be understood from FIG. 8, the number of transistors is very small, and a circuit which can perform high-speed parallel calculations of signals including analog signals can be constituted. Needless to say, this circuit has a smaller number of transistors than those of a conventional logic circuit, and is suitable for power savings as well as high-speed processing. According to the circuit of this embodiment, an absolute value calculation with detection precision of 20 mV or less if the power supply voltage is 5 V, i.e., a precision corresponding to 256 gradation levels, can be realized by the circuit having a very small number of transistors, as shown in FIG. 8. Also, needless to say, the present invention is not limited to this embodiment.

Fifth Embodiment

The fifth embodiment of the present invention will be described below with reference to the schematic circuit diagram shown in FIG. 9. In the fifth embodiment, a preferred example of a circuit for performing a calculation for determining if analog signals A and B are smaller than a predetermined value δ ($A-B<\delta$) will be explained.

Figure 9:
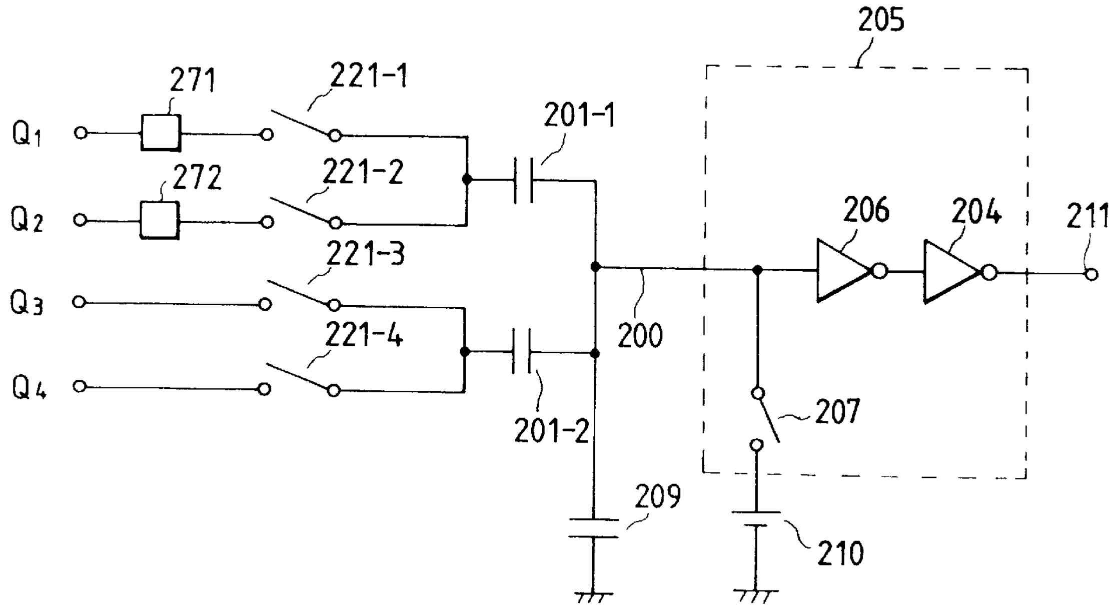

In FIG. 9, the circuit has input terminals Q1 to Q4. In this embodiment, a multiple-input circuit having four input terminals will be exemplified. The circuit also has switches 221-1 to 221-4. The circuit further has capacitors 201-1 and 201-2, which may or may not have a common capacitance. Also, the circuit has a sense amplifier 205, a first inverter 206 in the sense amplifier 205, a second inverter 204 in the sense amplifier 205, a reset switch 207 for resetting a terminal 200 which serves as the input terminal of the inverter 205 and to which the capacitors 201-1 and 201-2 are electrically commonly connected, a reset power supply 210, an output terminal 211 of the sense amplifier 205, and a capacitance 209 including a parasitic capacitance formed at the commonly connected terminal 200 of the capacitors 201. Hold circuits 271 and 272 are respectively connected between the input terminals Q1 and Q2, and the switches 221-1 and 221-2.

The operation of this embodiment will be described below. A voltage signal B(t) (V) as an analog signal is input to the input terminal Q1, and a voltage signal A(t) (V) as an analog signal is input to the input terminal Q2. On the other hand, a predetermined value δ (constant) is input to the input terminal Q3. The input terminal Q4 is arbitrarily set (0 V in this case). Analog voltages (B(t0) and A(t0)) at given time (t0) are respectively held in the hold circuits, and the switches 221-1 and 221-3 are set in an ON state to be connected to the one-terminal sides of the capacitors 201-1 and 201-2. In this state, the reset switch 207 is turned on to supply a voltage from the reset power supply 210 to the other-terminal sides of the capacitors 201-1 and 201-2, thereby resetting the commonly connected capacitor terminal 200 to V0 (e.g., 2.5 (V)). Subsequently, the switches 221-1 and 221-3, and the reset switch 207 are turned off, and the held potential A(t0) and a signal of 0 (V) are input to the one-terminal sides of the capacitors 201-1 and 201-2 by setting the switches 221-1 and 221-4 in an ON state. At this time, a potential V1 of the input portion of the sense amplifier 205 has a value determined by the following equations. Note that the capacitance of the capacitor 201-1 is represented by C1, and that of the capacitor 201-2 is represented by C2.

$$C1(V0-B(t0))+C2(V0-\delta)+Cz\cdot V0 = C1(V1-A(t0))+C2\cdot V1+Cz\cdot V1$$

$$\begin{aligned} V1 &= V0+\{C1(A(t0)-B(t0))-C2\cdot\delta\}/(C1+C2+Cz) \\ &= V0+\{C1(A(t0)-B(t0)-(C2/C1)\delta)\}/(C1+C2+Cz) \end{aligned}$$

where Cz is the capacitance including the parasitic capacitance at the commonly connected terminal 200.

If C1=C2 is set for the sake of simplicity, V1 becomes:

$$V1=V0+(A(t0)-B(t0)-\delta)C1/\Sigma Ci$$

for $\Sigma Ci=C1+C2+Cz$

If V0 is assumed to be the logic inversion potential of the inverter 206 at the input terminal side of the sense amplifier, the inverter outputs an inverted output if the value (A(t0)−B(t0)−δ) is positive; otherwise, it outputs a non-inverted output. After all, in correspondence with a change in potential input to the input terminal side of each capacitor, a HIGH-LEVEL digital signal is output to the output terminal 211 of the sense amplifier 205 when $A(t0)-B(t0)>\delta$; a LOW-LEVEL digital signal when $A(t0)-B(t0)<\delta$. With the above-mentioned arrangement, a circuit for performing high-speed parallel calculations of two analog signals which are input at the same timing can be constituted. This circuit has a smaller number of transistors than those of a conventional logic circuit, and is suitable for power savings as well as high-speed processing. Needless to say, the present invention is not limited to the circuit and use method of this embodiment.

Sixth Embodiment

Figure 10:
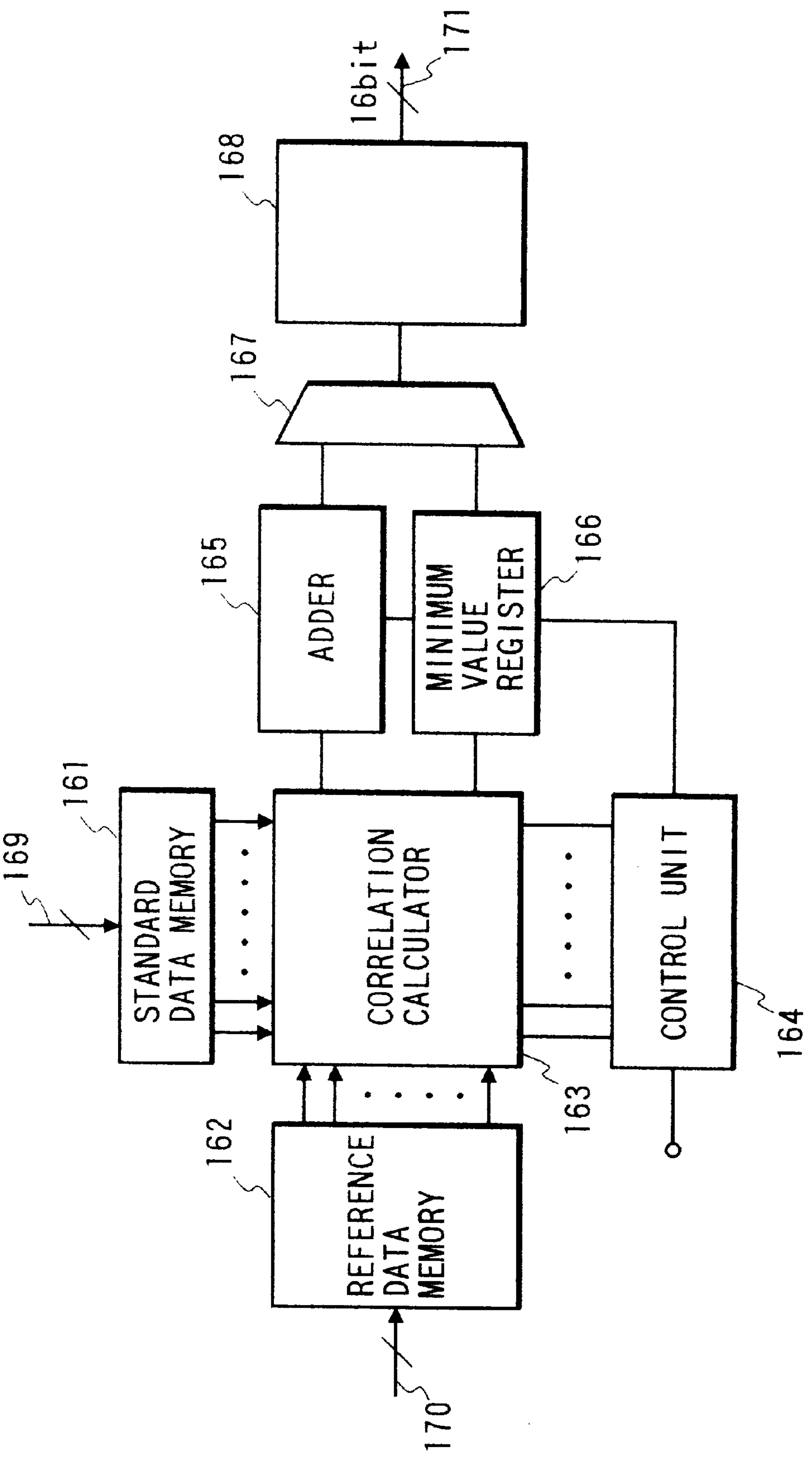
FIG. 10 is a schematic block diagram for explaining an example of a signal processing system to which the present invention is applied.

FIG. 10 shows the sixth embodiment of the present invention. FIG. 10 is a schematic block diagram showing a preferred example in which the present invention is applied to a motion detection chip for, e.g., dynamic images. Referring to FIG. 10, the chip includes memories 161 and 162 for respectively storing standard data and reference data, and a correlation calculator 163 for performing an absolute value calculation for the values of the standard and reference data. The correlation calculator 163 uses the circuit described in the above embodiments. The chip also includes a control unit 164 for controlling the entire chip, an adder 165 for adding the correlation results from the correlation calculator 163, a register 166 for storing a minimum sum from the adder 165, a comparison/storage unit 167 which serves as a comparator, and stores an address corresponding to the minimum value, and an output buffer/output result storage unit 168. A standard data string is input to an input bus 169, and a reference data string to be compared with the standard data string is input to an input bus 170. The memories 161 and 162 comprise SRAMs, and are constituted by normal CMOS circuits.

Data supplied from the reference and standard data memories 162 and 161 to the correlation calculator 163 can be processed by high-speed parallel processing since they are subjected to a correlation calculation by the correlation calculation circuit of the present invention. For this reason, the chip can not only attain very high-speed processing, but also be constituted by a smaller number of elements, thus reducing the chip size and cost. The correlation calculation result is scored (evaluated) by the adder 165, and is compared with the contents of the register 166 which stores the maximum correlation calculation result (minimum sum) before the current correlation calculation by the comparison/ storage unit 167. If the current calculation result is smaller than the previous minimum value, the current result is newly stored in the register 166; if the previous result is smaller than the current result, the previous result is maintained. With this operation, the maximum correlation calculation result is always stored in the register 166, and upon completion of the calculations of all the data strings, the final correlation result is output from an output bus 171 as, e.g., a 16-bit signal.

The correlation calculator 163 for performing the absolute value calculation, the control unit 164, the adder 165, the register 166, the comparison/storage unit 167, and the output result storage unit 168 are constituted by conventional CMOS circuits. Since the correlation calculator 163 or the like is one which comprises a semiconductor device having multiple input terminals via an analog processing circuit and performs an absolute value calculation, and includes a sense amplifier, it can realize an accurate operation, thus realizing high-speed processing. As has been described above, not only high-speed processing and low cost are realized but also the consumption current can be reduced since calculations are executed on the basis of capacitances, thus realizing low consumption power. For this reason, the present invention is suitably applied to a portable equipment such as an 8-mm VTR camera or the like.

Seventh Embodiment

An example of a calculation processing method according to the present invention will be described below while taking motion detection of, e.g., an image as an example. Let $x_{ij}$ ($1 \leqq i \leqq n$, $1 \leqq j \leqq m$) be data of the first frame at time $t_1$, and $y_{ij}$ ($1 \leqq i \leqq n$, $1 \leqq j \leqq m$) be data of the second frame at time $t_2$. Assume that where image data in a certain region of the data $x_{ij}$, e.g., ($x_{34}$, $x_{44}$, $x_{35}$, $x_{45}$) have moved at time $t_2$ will be examined. In this case, a search region $y_{kl}$ ($k \leqq n$, $l \leqq m$) is designated from the data $y_{ij}$. Most preferably, the movement of data must be examined on the entire region. Alternatively, if a region to which an image is assumed to move during the interval between times $t_1$ and $t_2$ is selected by utilizing a prediction function, the number of calculations can be limited accordingly. If all data rows corresponding to ($x_{34}$, $x_{44}$, $x_{35}$, $x_{45}$) in the search region $y_{kl}$ are subjected to correlation calculations, a huge calculation circuit is required. For this reason, in this embodiment, y data rows of only a selected region are selected from the search region by thinning out.

In this embodiment, data rows are selected by shifting pixels by three each in the vertical and horizontal directions. For example, ($y_{11}$, $y_{21}$, $y_{12}$, $y_{22}$), ($y_{14}$, $y_{24}$, $y_{15}$, $y_{25}$), and the like are selected.

These data rows are digital/analog-converted (D/A-converted). After D/A conversion, the following calculations are made. For example, calculations for the row ($y_{11}$, $y_{21}$, $y_{12}$, $y_{22}$) are:

$$\left.\begin{array}{r} \text{if } |X_{34}-Y_{11}|<\delta_1,\ \Delta_1^1=1 \\ \text{otherwise, } \Delta_1^1=0 \\ \text{if } |X_{44}-Y_{21}|<\delta_1,\ \Delta_2^1=1 \\ \text{otherwise, } \Delta_2^1=0 \\ \text{if } |X_{35}-Y_{12}|<\delta_1,\ \Delta_3^1=1 \\ \text{otherwise, } \Delta_3^1=0 \\ \text{if } |X_{45}-Y_{22}|<\delta_1,\ \Delta_4^1=1 \\ \text{otherwise, } \Delta_4^1=0 \end{array}\right] \tag{1}$$

Similarly, calculations for ($y_{14}$, $y_{24}$, $y_{15}$, $y_{25}$) are:

$$\left.\begin{array}{r} \text{if } |X_{34}-Y_{14}|<\delta_1,\ \Delta_1^2=1 \\ \text{otherwise, } \Delta_1^2=0 \\ \text{if } |X_{44}-Y_{24}|<\delta_1,\ \Delta_2^2=1 \\ \text{otherwise, } \Delta_2^2=0 \\ \text{if } |X_{35}-Y_{15}|<\delta_1,\ \Delta_3^2=1 \\ \text{otherwise, } \Delta_3^2=0 \\ \text{if } |X_{45}-Y_{25}|<\delta_1,\ \Delta_4^2=1 \\ \text{otherwise, } \Delta_4^2=0 \end{array}\right] \tag{2}$$

The above-mentioned calculations are executed for the data rows initially selected from the search region $y_{kl}$, and addition processing is performed for the respective data row.

Figure 11:
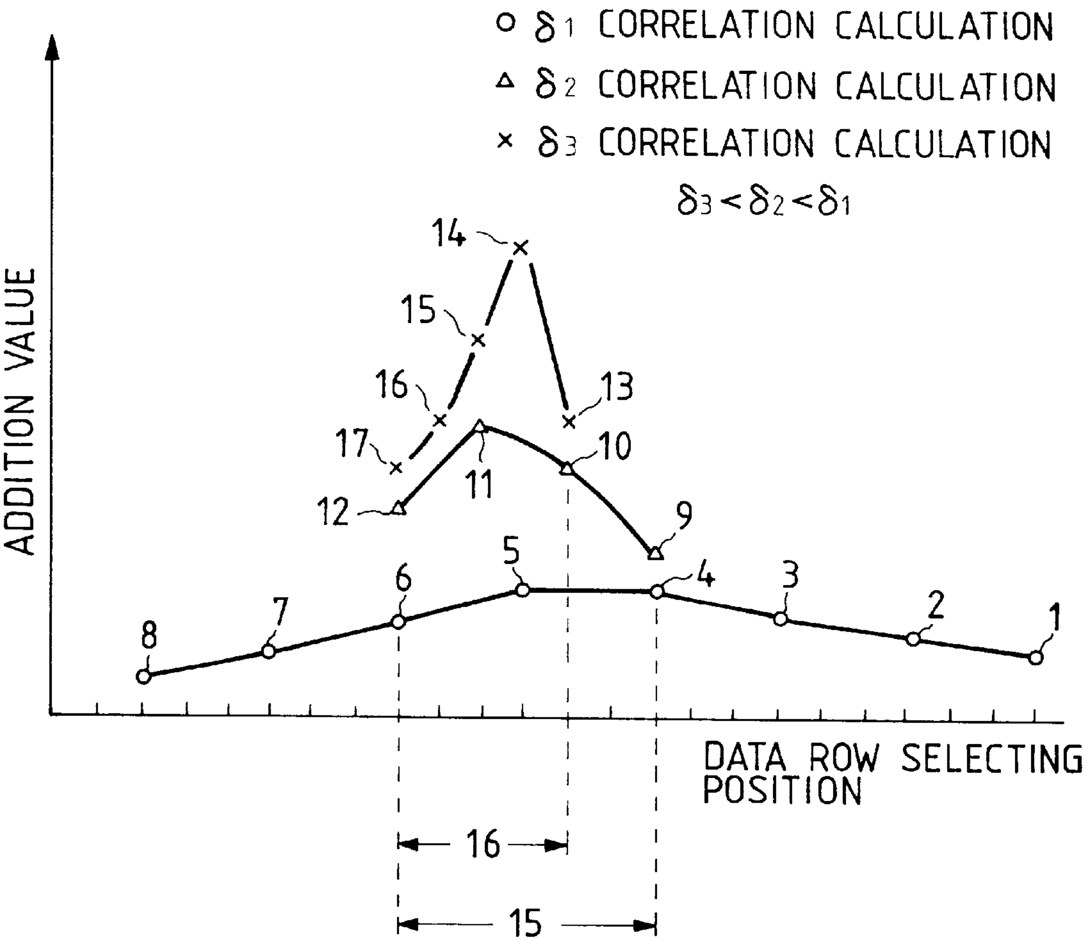
FIG. 11 is a graph for explaining an example of a calculation processing method of the signal processing system.

Data of addition values $\Sigma_i\Delta^1_i$, $\Sigma_i\Delta^2_i$, . . . , $\Sigma_i\Delta^P_i$ are indicated by 1 to 8 in FIG. 11. In FIG. 11, 1 indicates the value $\Sigma_i\Delta^1_i$ and 2 indicates the value $\Sigma_i\Delta^2_i$. In this case, when p=5, the addition value becomes maximum, and the second and third maximum addition values are obtained when p=4 and p=6. In this embodiment, a range including the first to third maximum addition values is determined as the next data row selection region, as indicated by 15 in FIG. 11. Data rows corresponding to ($x_{34}$, $x_{44}$, $x_{35}$, $x_{45}$) are similarly selected from this second search region $y'_{kl}$, and calculations similar to those described above are performed. Differences from the previous calculations are that the discrimination condition range δ for discriminating the presence/absence of correlation is narrowed to improve precision, and the selection interval upon selection of data rows is narrowed. In this embodiment, data rows are selected by shifting pixels by two each time. FIG. 11 shows the results obtained at that time.

The second calculation results under the discrimination condition $\delta_2$ are indicated by 9 to 12 in FIG. 11. In this case, the data row indicated by 11 exhibits a maximum correlation, and then, data rows 10 and 12 exhibit the second and third maximum correlations. As in the previous calculations, the search region can be limited to a portion indicated by 16 in FIG. 11. Therefore, correlation calculations are performed in the further limited search region 16 while the discrimination condition range $\delta_3$ is set to be narrower than the previous one. As a result, a position indicated by 14 in FIG. 11 has the strongest correlation with data $x_{ij}$($x_{34}$, $x_{44}$, $x_{35}$, $x_{45}$) of the first frame at time $t_1$, and a motion vector can be calculated.

In this embodiment, only the region of given data ($x_{34}$, $x_{44}$, $x_{35}$, $x_{45}$) has been exemplified. Needless to say, these calculations are parallelly performed for a plurality of regions.

In the example described above, the result outputs of the discrimination condition assume values "1" and "0".

However, the present invention is not limited to this, and multi-value outputs may be calculated.

As has been described in the above-mentioned algorithm, the method of this embodiment can hierarchically execute correlation calculations, and the correlation calculations themselves can be flexibly changed in units of layers.

As shown in FIG. 11, when the discrimination condition range is widened, a change in evaluation function (addition value in this method) is small when it falls outside an optimal value range, but the change itself extends over a wide region. Therefore, this method is suitable for roughly searching a region where an optimal value may be present. When searching is performed intermittently, if the searching range slightly falls outside the optimal range, its evaluation function has almost no change, and changes abruptly only in the vicinity of the optimal value. In this case, a region where the optimal value is present may be missed. For the above-mentioned reasons, the method of this embodiment can execute high-speed, high-precision correlation calculations.

Figure 12:
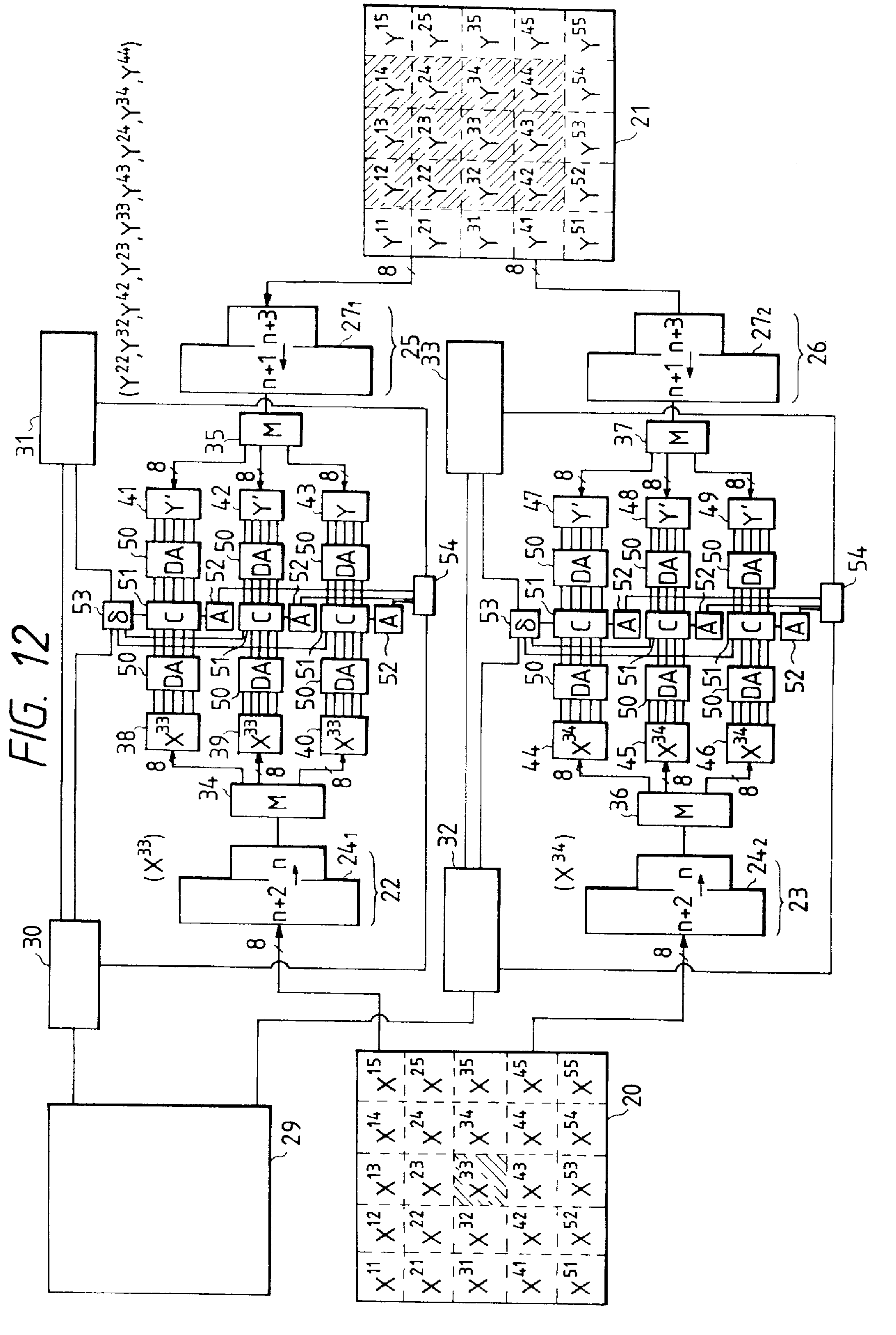
FIG. 12 is a schematic circuit diagram for practicing the calculation processing method utilizing the present invention.

A preferred example of the LSI circuit arrangement for executing the above-mentioned algorithm will be described below with reference to FIG. 12. Referring to FIG. 12, a frame memory 20 stores image data at time $t_1$ (e.g., data converted into luminance data may be stored). A frame memory 21 stores image data at time $t_2$. Data in each frame memory are divided into a plurality of regions, as indicated by $X^{ij}$ (i=1 to 5, j=1 to 5). In order to detect the motion amount in units of divided regions, for example, data of regions $X^{33}$ and $X^{34}$ are read out to buffer memories 22 and 23 in units of detection regions. In FIG. 12, the two buffer memories 22 and 23 are arranged. However, the number of buffer memories may be changed in correspondence with design. Movement of an image at time $t_2$ is examined with reference to data at time $t_1$ stored in the frame memory 20. Therefore, data n required at time $t_1$ can be only image data in the regions $X^{33}$ and $X^{34}$. However, at time $t_3$, since examination is made with reference data stored at time $t_2$, data n+2 at time $t_3$ extend over broad search ranges, as indicated by $24_1$ and $24_2$ in FIG. 12.

On the other hand, data in the frame memory 21 are similarly read out to buffers 25 and 26. As described above, in order to read out data including the search region of data at time $t_1$, data in broad overlapping ranges, as indicated by $27_1$ and $27_2$, are read out (in FIG. 12, nine y images are predicted for one x image).

Subsequently, a control unit 29 instructs a thin-out amount and discrimination condition for searching upon execution of hierarchical correlation calculations to correlation calculation unit controllers 30, 31, 32, and 33.

The reason why the controllers 30 to 33 are arranged is to individually set the discrimination condition and the like in correspondence with regions having different images, e.g., a very low-contrast image, a very high-contrast image, and the like. In accordance with the thin-out amount, the correlation calculation unit controllers 30 to 33 distribute desired data to second buffer memories 38, 39, 40, 41, 42, 43, 44, 45, 46, 47, 48, and 49 via multiplexers 34, 35, 36, and 37. As shown in FIG. 12, image data in the region $X^{33}$ are transferred to the buffer memories 38, 39, and 40, and image data in the region $X^{34}$ are transferred to the buffer memories 44, 45, and 46. On the other hand, data rows, to be compared with data in the region $X^{33}$, of those in regions $Y^{22}$, $Y^{32}$, $Y^{42}$, $Y^{23}$, $Y^{33}$, $Y^{43}$, $Y^{24}$, $Y^{34}$, and $Y^{44}$ are transferred to the buffer memories 41, 42, and 43 in accordance with the thin-out amount. Also, to the buffer memories 47, 48, and 49, data rows corresponding to data in the region $X^{34}$ are transferred in accordance with the thin-out amount. After data are transferred to the respective buffer memories, these data are converted into analog data via D/A converters 50. After conversion to analog data, $|X-Y|<\delta$ discrimination circuits 51 perform comparison calculations of X and Y data of the respective data rows, and the calculation results are added by adders 52. Note that a discrimination parameter δ of the discrimination circuits 51 is supplied from power supply circuits 53. The addition results from the adders 52 are input to parallel input type maximum value detection circuits 54, which supply addresses of Y' data rows that exhibit maximum values to the correlation calculation unit controllers 30 to 33. The detailed arrangement and operation of the correlation calculation circuit of the present invention will be described in detail later.

The correlation calculation unit controllers 30 to 33 determine addresses near the addresses of the Y' data rows that exhibit maximum values, i.e., the search regions for the next correlation calculations. In this case, a programmable circuit arrangement is adopted so as to determine the determination method such as a method of determining the search region on the basis of data rows that exhibit higher correlation data from the maximum value detection circuit, a method of determining address positions around data that exhibits a maximum value in accordance with a desired rule, and the like in correspondence with application purposes. However, when the method is determined, a fixed hardware circuit is preferably used. Correlation calculations for the next limited regions can be attained by repetitively operating the circuit shown in FIG. 12, and a detailed description thereof will be omitted.

Figure 13:
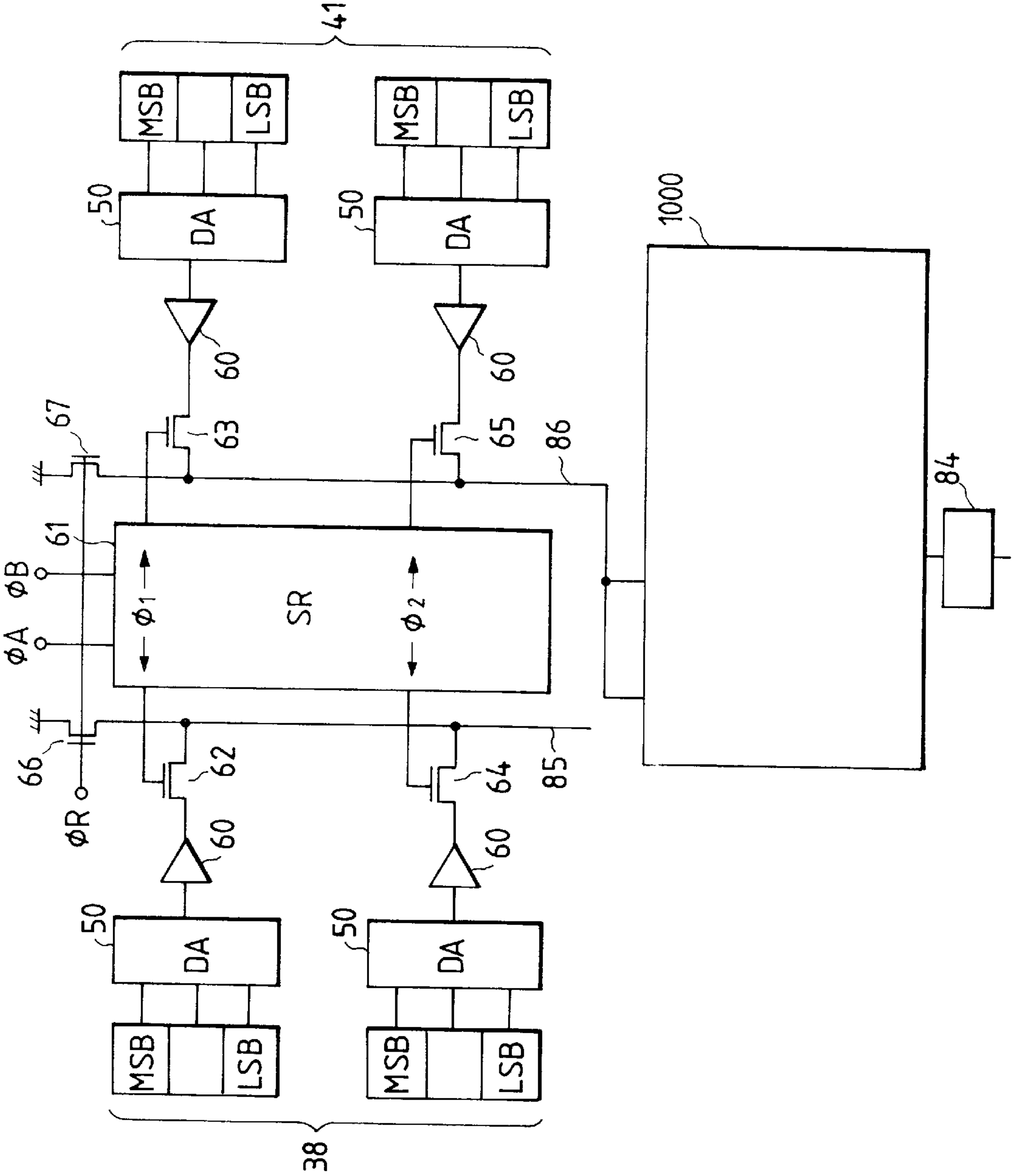
FIG. 13 is a schematic circuit diagram for explaining a circuit portion for performing correlation calculations and addition processing in the circuit shown in FIG. 12.

An example of the detailed circuit associated with correlation calculations will be described below. The same reference numerals in FIG. 13 denote the same parts as in FIG. 12, and a detailed description thereof will be omitted. Referring to FIG. 13, amplifiers 60 amplify analog signals output from the D/A converters 50, and a shift register 61 sequentially generates pulses $\phi_1$ and $\phi_2$ in response to pulses $\phi_A$ and $\phi_B$. Before the shift register 61 is driven, data output lines 85 and 86 are reset by a pulse $\phi_R$ and are set in a floating state. Thereafter, an analog signal corresponding to the digital signal stored in the buffer memory 38 is read out onto the output line 85 in response to the pulse $\phi_1$, and an analog signal corresponding to the digital signal stored in the buffer memory 41 is read out onto the output line 86 in response to the pulse $\phi_2$. The output lines 85 and 86 are connected to a circuit 1000.

In this case, as the circuit 1000, a circuit which outputs a HIGH-LEVEL signal when the absolute value of the difference between the signals on the output lines 85 and 86 is equal to or smaller than δ, as has been described in the second or fourth embodiment, can be used.

As described above, a signal processing system which not only can attain a small circuit scale, high-speed processing, and low consumption power but also has a high degree of freedom by changing the value δ can be realized.

With the above-mentioned arrangement, when the absolute value of the difference between the signals on the output lines 85 and 86 is equal to or smaller than the voltage δ, a value $V_{DD}$ is output; otherwise, the ground potential is output. On the other hand, the discrimination condition can be changed by the voltage δ. Upon completion of the correlation calculations of the buffer memories 38 and 41 in response to the pulse $\phi_1$, the output lines 85 and 86 are reset again by the pulse $\phi_R$, and the correlation calculations of data stored in the buffers 39 and 42 are executed. More specifically, since the calculation results are output time-serially, an adder 84 sequentially adds these results. Upon application of the absolute value circuit of the present invention, a digital output signal can be obtained based on an analog signal with a simple arrangement as an advantageous feature of the semiconductor device of the present invention.

The arrangement of the maximum value detection circuit will be described below. In one method, a comparator, register, and counter are arranged, and input data is compared with the maximum value of data input so far. When the currently input data is larger than the maximum value, the data is stored in the register. Data corresponding to the maximum value can be identified by counting the address of input data using the counter, and storing this information in the register. Upon detection of several largest data, the arrangement of this embodiment may be connected in a multi-stage structure.

Figure 14:
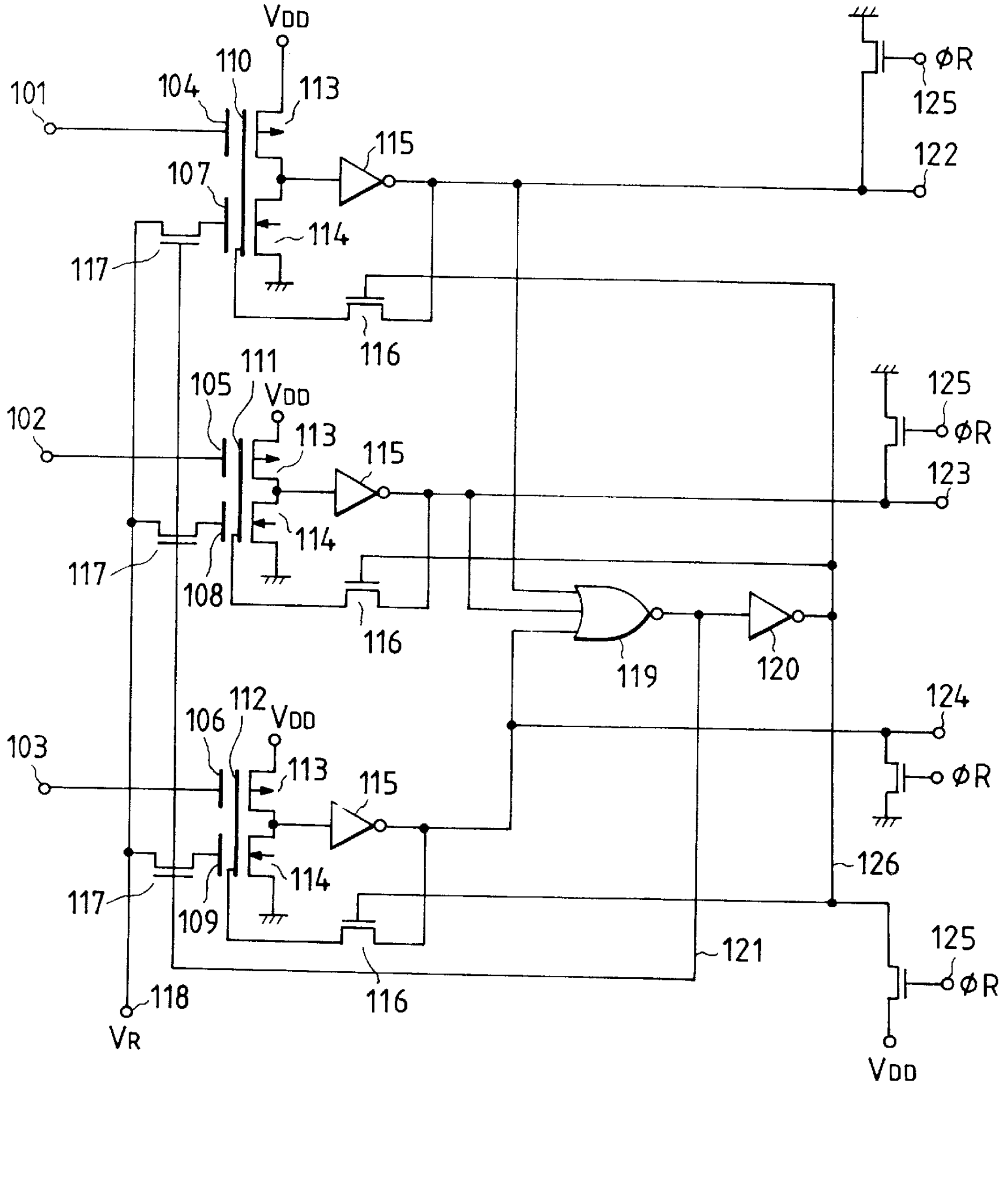
FIG. 14 is a schematic circuit diagram for explaining an analog value calculation according to the embodiment of the present invention.

FIG. 14 shows a circuit for performing maximum value detection by a circuit using a floating gate. Referring to FIG. 14, terminals 101, 102, and 103 respectively receive the correlation calculation result (i.e., the sum of the discrimination results of the absolute values of respective pixels) between data in the region $X^{33}$ and data stored in the buffer memory 41, the correlation calculation result between data in the region $X^{33}$ and data stored in the buffer memory 42, and the correlation calculation result between data in the region $X^{33}$ and data stored in the buffer memory 43. These terminals 101 to 103 are respectively connected to input gates 104, 105, and 106, and other input gates 107, 108, and 109 are connected to a ramp voltage power supply 118 via MOS switches 117. These input gates are those of CMOS inverters which are constituted by p- and n-MOS transistors 113 and 114 via the floating gates 110, 111, and 112. The outputs from these inverters are connected to output terminals 122, 123, and 124 via conventional inverters 115, and are also connected to a NOR gate 119. An output 121 from the NOR gate 119 is connected to the gates of the MOS switches 117. The output from the NOR gate 119 is also connected to the gates of MOS switches 116 via an inverter 120. The outputs from the output terminals 122, 123, and 124, and the inverter 120 are connected to the ground potential and $V_{DD}$ via reset MOS switches 125.

The operation of the maximum value detection circuit will be described below. Before operation, a pulse $\phi_R$ is set in a high state to reset output lines 122 to 124 to the ground potential, and the MOS switches 116 are turned on to reset the floating gate potentials of the gates 110, 111, and 112 to the ground potential. Subsequently, the pulse $\phi_R$ is set at low level to set the output terminals and the floating gates in a floating state. Since the output terminals 122 to 124 have the GND potential, the output from the NOR gate 119 is in a high state, and the gates of the MOS switches 117 are in an ON state. On the other hand, since an output 126 from the inverter 120 is in a low state, the MOS switches 116 are in an OFF state. Subsequently, the ramp voltage $V_R$ is raised from low level to high level. The terminals 101, 102, and 103 receive the correlation calculation results from the reset state. Then, the state of the inverter corresponding to the highest voltage of these input values changes from a high state to a low state, i.e., the output from the corresponding inverter 115 changes to a high state ($V_{DD}$). As a result, the output from the NOR gate 119 changes to low level, and the output from the inverter 120 changes to high level. Therefore, the gates of the MOS switches 116 are set in an ON state. Then, only the output from the inverter which received the maximum value fixes the floating state at high level, and other inverters fix their floating gates at low level. On the other hand, in the gates which receive the ramp voltage $V_R$ from the power supply 118, since the output from the NOR gate 119 changes to low level, the MOS switches 117 are set in an OFF state, and the ramp voltage $V_R$ from the power supply 118 ceases to be applied thereto. With the above-mentioned operation principle, only the terminal which received the maximum value can output high level, and other terminals can output low level. In this arrangement, the MOS switches 117 are arranged, but are not always necessary. Needless to say, the delay times of pulses must be taken into consideration, and delay circuits, and the like must be inserted. By utilizing a high-level pulse upon input of a maximum value, the unit may be separated and extended to a circuit for detecting the second maximum value.

As described above, with the arrangement of this embodiment, a circuit for performing parallel calculations for analog signals can constitute a signal processing system which is constituted by a small number of transistors, can attain a high calculation speed, and is suitable for power saving.

Eighth Embodiment

The eighth embodiment of the present invention will be described below with reference to FIGS. 15A to 15C. This embodiment presents a chip arrangement which performs high-speed image processing before image signal data is read out upon integration of the technique of the present invention and an optical sensor (solid-state image pickup element).

Figure 15A:
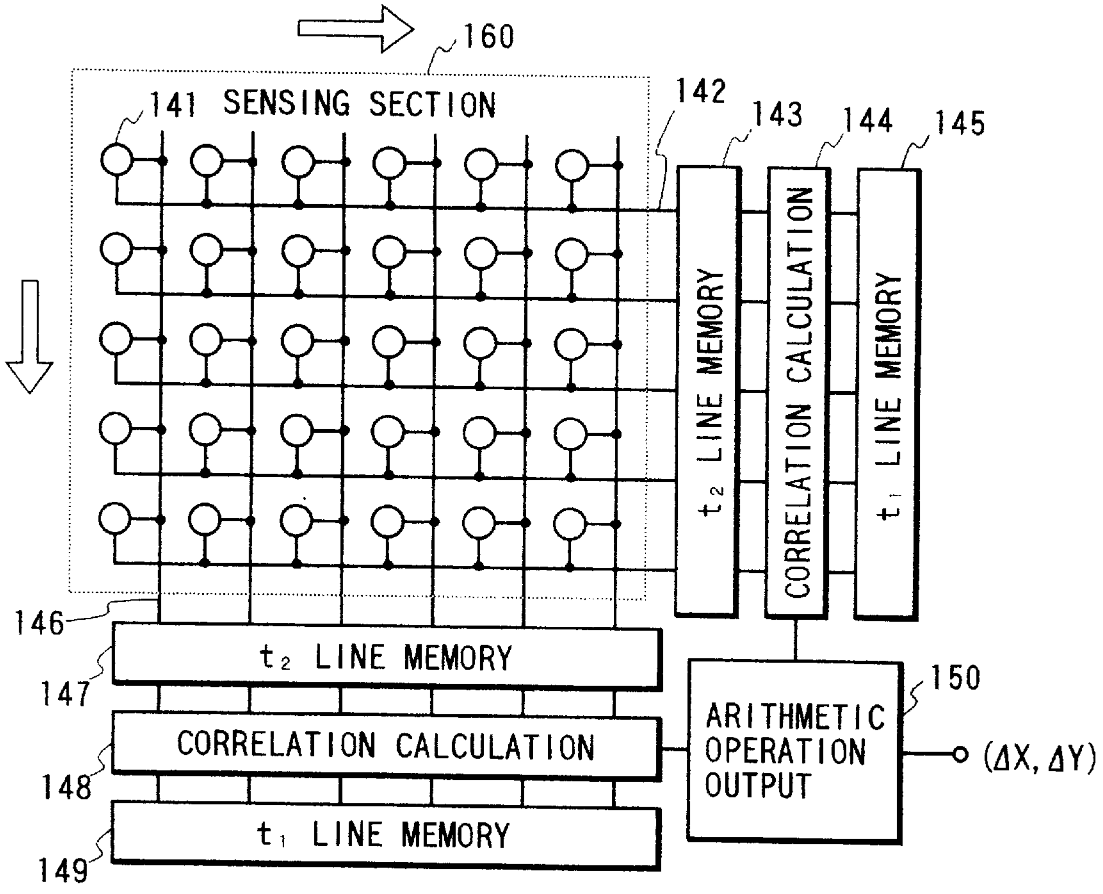
FIG. 15A is a schematic block diagram for explaining an embodiment in which the present invention is applied to image processing.
Figure 15B:
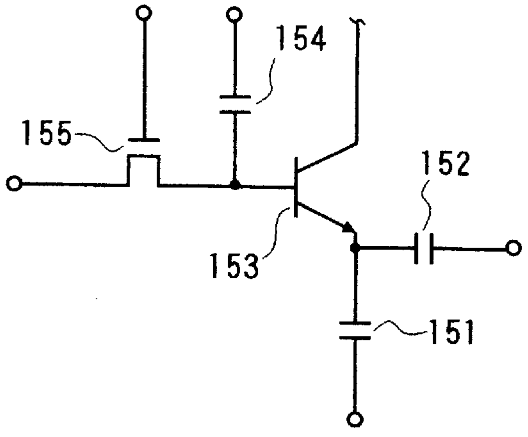
FIG. 15B is a schematic circuit diagram for explaining a preferred arrangement of a pixel portion of FIG. 15A.
Figure 15C:
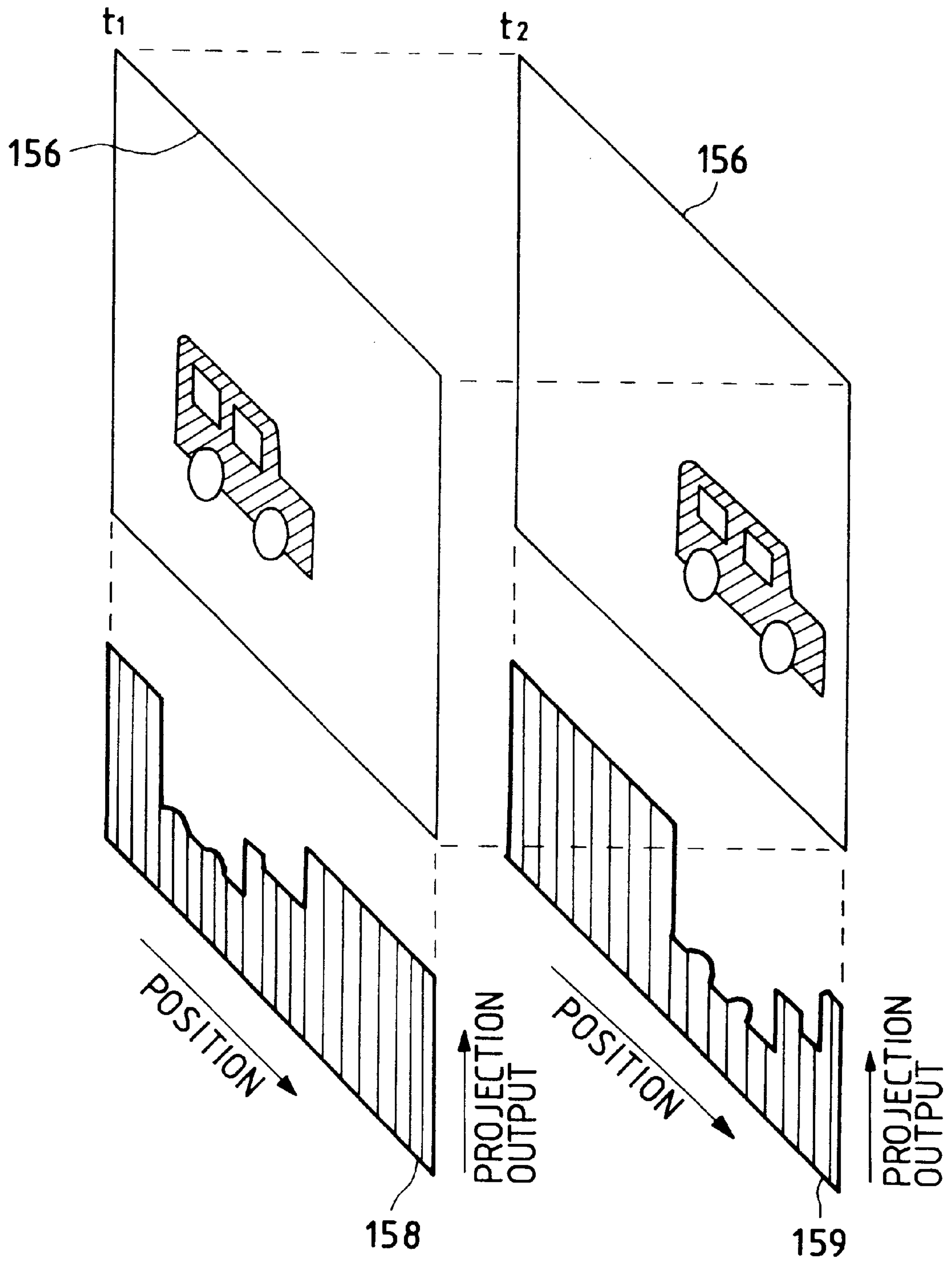
FIG. 15C is a schematic view for explaining the concept of the calculation contents of the embodiment of the present invention.

FIG. 15A is a schematic block diagram showing a preferred example of the entire arrangement of this embodiment, FIG. 15B is a schematic circuit diagram showing a preferred example of the arrangement of a pixel portion of this embodiment, and FIG. 15C is a schematic view for explaining the arithmetic operation contents of this embodiment.

Referring to FIG. 15A, the chip includes light-receiving portions 141 each including a photoelectric conversion element, line memories 143, 145, 147, and 149, correlation calculation units 144 and 148, and an arithmetic operation output unit 150. The light-receiving portion 141 shown in FIG. 15B includes coupling capacitance means 151 and 152 for connecting optical signal output terminals and output bus lines 142 and 146, a bipolar transistor 153, a capacitance means 154 connected to the base region of the bipolar transistor, and a switch MOS transistor 155. In FIG. 15B, image data input to an image data sensing section 160 is photoelectrically converted by the base region of the bipolar transistor 153.

An output corresponding to the photoelectrically converted photocarriers is read out to the emitter of the bipolar transistor 153, and raises the potentials of the output bus lines 142 and 146 in accordance with an input stored charge signal via the coupling capacitance means 151 and 152. With the above-mentioned operation, the sum of the outputs from the pixels in the column direction is read out to the line memory 147, and the sum of the outputs from the pixels in the row direction is read out to the line memory 143. In this case, if a region where the base potential of the bipolar transistor is raised via the capacitance means 154 of each pixel portion is selected using, e.g., a decoder (not shown in FIG. 15A), the sums in the X- and Y-directions of an arbitrary region on the sensing section 160 can be output.

For example, as shown in FIG. 15C, when an image 156 is input at time $t_1$, and an image 157 is input at time $t_2$, output results 158 and 159 obtained by respectively adding these images in the Y-direction become image signals representing the moving state of a vehicle shown in FIG. 15C, and these data are respectively stored in the line memories 147 and 149 shown in FIG. 15A. Similarly, data obtained by adding image data in the X-direction are stored in the line memories 143 and 145.

As can be seen from the output results 158 and 159 shown in FIG. 15C, the data of the two images shift in correspondence with the motion of the image. Thus, when the correlation calculation unit 148 calculates the shift amount, and the correlation calculation unit 144 similarly calculates data in the row direction, the motion of an object on a two-dimensional plane can be detected by a very simple method.

The correlation calculation units 144 and 148 shown in FIG. 15A can comprise the correlation calculation circuit of the present invention. Each of these units has a smaller number of elements than the conventional circuit, and, in particular, can be at the sensor pixel pitch.

The sensor of the present invention comprises a bipolar transistor. However, the present invention is also effective for a MOS transistor or only a photodiode without arranging any amplification transistor.

Furthermore, in this embodiment, the above-mentioned arrangement performs a correlation calculation between data strings at different times. Alternatively, when the X- and Y-projection results of a plurality of pattern data to be recognized are stored in one memory, pattern recognition can also be realized.

As described above, when the pixel input unit and the correlation calculation circuit and the like of the present invention are combined, the following effects are expected.

(1) Since data which are parallelly and simultaneously read out from the sensor are subjected to parallel processing unlike in the conventional processing for serially reading out data from the sensor, high-speed motion detection and pattern recognition processing can be realized.

(2) Since a 1-chip semiconductor device including a sensor can be constituted, and image processing can be realized without increasing the size of peripheral circuits, the following high-grade function products can be realized with low cost: (a) control equipment for turning the TV screen toward the user direction; (b) control equipment for turning the wind direction of an air conditioner toward the user direction; (c) tracing control equipment for an 8-mm VTR camera; (d) label recognition equipment in a factory; (e) reception robot that can automatically recognize a person; (f) inter-vehicle distance controller for a vehicle; and the like.

The integration of the image input unit and the circuit of the present invention has been described. The present invention is effective not only for image data but also for, e.g., recognition processing of audio data.

As described above, according to the present invention, there can be provided a semiconductor device, which can constitute a circuit for performing parallel calculations for analog signals by a smaller number of transistors than those in a conventional logic circuit, can attain a high calculation speed, and hence, is suitable for power savings, a signal processing system using the same, and a calculation method therefor.

In a semiconductor device constituted by the multiple input terminals, capacitors connected to the multiple input terminals, and a sense amplifier to which the other terminals of the capacitors are commonly connected, since an analog signal processing circuit is arranged between multiple input terminals and capacitors, a digital output signal can be obtained as an absolute value comparison output or a magnitude comparison output with respect to an analog input signal, and the processing circuit and method are very effective for signal processing of image signals, audio signals, and the like since the processing circuit and processing method can be realized by MOS transistors which can easily attain a small circuit scale and low consumption power and can be integrated on a single chip, a signal processing system using the same, and a calculation method therefor.

Furthermore, with the semiconductor device of the present invention, a circuit for performing parallel calculations can be constituted by a smaller number of transistors than those of a conventional CMOS type logic circuit, thus attaining high sensitivity with respect to a weak signal.

Upon application of the semiconductor device of the present invention to a semiconductor circuit, a correlation calculation circuit, and A/D and D/A converters, and to a signal processing system using these circuits, a reduction of the circuit scale, an improvement in calculation speed, a reduction of consumption power, a reduction of the manufacturing cost, and an improvement in manufacturing yield can be achieved.

What is claimed is:

1. A signal processing system comprising a plurality of semiconductor devices, each of said semiconductor devices comprising:

a plurality of input terminals;

first and second capacitors each having a respective first terminal and a respective second terminal, said first terminals of said first and second capacitors being connected respectively to said plurality of input terminals, said second terminals of said first and second capacitors being directly connected in common to a common sense amplifier, wherein said first terminal of said first capacitor inputs a signal to be processed, and said first terminal of said second capacitor inputs a reference signal;

switch means for resetting to a desired voltage a terminal of said sense amplifier connected to said second terminals of said first and second capacitors; and an analog signal processing circuit provided between at least one of said plurality of input terminals and the first terminal of the first capacitor corresponding to said at least one of said plurality of input terminals, said system outputting a signal in correspondence with calculation results provided by said semiconductor devices.

2. A semiconductor device according to claim 1, wherein said sense amplifier comprises at least two inverters.

3. A calculation method using a semiconductor device comprising:

a plurality of input terminals;

first and second capacitors each having a respective first terminal and a respective second terminal, said first terminals of said first and second capacitors being connected respectively to said plurality of input terminals, said second terminals of said first and second capacitors being directly connected in common to a common sense amplifier, wherein said first terminal of said first capacitor inputs a signal to be processed, and said first terminal of said second capacitor inputs a reference signal;

switch means for resetting to a desired voltage a terminal of said sense amplifier connected to said second terminals of said first and second capacitors; and an analog signal processing circuit provided between at least one of said plurality of input terminals and the first terminal of the first capacitor corresponding to said at least one of said plurality of input terminals, wherein a potential of said first capacitor connected to said analog signal processing circuit, during a reset period, has no correlation to a potential thereat during a sensing period, and said sense amplifier produces an output according to a relation of a difference between the potential during the reset period and the potential during the sensing period to a potential of a signal for a reference.

4. A calculation method for a semiconductor device comprising:

a plurality of input terminals;

first and second capacitors each having a respective first terminal and a respective second terminal, said first terminals of said first and second capacitors being connected respectively to said plurality of input terminals, said second terminals of said first and second capacitors being directly connected in common to a common sense amplifier, wherein said first terminal of said first capacitor inputs a signal to be processed, and said first terminal of said second capacitor inputs a reference signal;

switch means for resetting to a desired voltage a terminal of said sense amplifier connected to said second terminals of said first and second capacitors, wherein at least two of said plural input terminals and the first terminal corresponding to at least two of said plural input terminals are connected via a second switch means; and at least one analog signal processing circuit provided between at least one of said plurality of input terminals and the first terminal of the first capacitor corresponding to said at least one of said plurality of input terminals, wherein at least one of the input terminals is connected to the first capacitor via an additional switch, and wherein said additional switch connected to the commonly connected capacitors has an ON state period during a reset period of the commonly connected electrodes of the capacitors, at least one additional switch connected to the commonly connected capacitors is set in an ON state after said switch is set in an OFF state and the reset period ends, and a potential at the input side of the first capacitor during the reset period has no correlation to a potential thereat during a sensing period, and said sense amplifier produces an output according to a relation of a difference between the potentials of the input signal during the reset period and the sensing period.

5. A semiconductor device, comprising:

a plurality of input terminals;

first and second capacitors each having a respective first terminal and a respective second terminal, said second terminals of said first and second capacitors being directly connected in common to an inverter constituting a common sense amplifier;

switch means for resetting to a desired voltage of terminal of said inverter of said sense amplifier connected to the second terminals of said first and second capacitors; and an analog signal processing circuit provided between at least one of said plurality of input terminals and the first terminal of the first capacitor corresponding to said at least one of said plurality of input terminals, wherein, corresponding to the first terminal of said second capacitor, at least one of said plurality of input terminals inputs a reference potential.

6. A semiconductor device according to claim 5, wherein said analog signal processing circuit comprises an amplifier.

7. A semiconductor device according to claim 6, wherein said amplifier comprises a voltage amplifier.

8. A semiconductor device according to claim 5, wherein said analog signal processing circuit comprises a hold circuit.

9. A semiconductor device according to claim 5, wherein said switch means for resetting the commonly connected electrode sides of the capacitors comprises a MOSFET, and a structural body for inputting a pulse having a phase opposite to a phase of a pulse for driving said switch means is connected to the commonly connected electrodes.

10. A semiconductor device according to claim 9, wherein said structural body comprises a capacitor.

11. A semiconductor device according to claim 9, wherein said structural body comprises a MOSFET.

12. A semiconductor device according to claim 5, wherein at least one of said first and second capacitors is connected to a corresponding one of said plurality of input terminals through a switch.

13. A semiconductor device according to claim 5, wherein said first and second capacitors are connected in parallel commonly to said analog signal processing circuit.

14. A semiconductor device according to claim 13, wherein said capacitors are divided into at least two groups, and, in each of the groups, the first terminals of the capacitors connected to said analog signal processing circuit, and the first terminal of the capacitors not connected to said analog signal processing circuit, are connected to a common input terminal.

15. A semiconductor device according to claim 5, wherein said first and second capacitors are connected to the analog signal processing circuit, and said first and second capacitors are divided into at least two groups, one of the groups including the capacitors connected to said analog signal processing circuit, the other including the capacitors not connected to said analog signal processing circuit, the second terminals of the capacitors of each group being connected in common, and said sense amplifier and said switch means being connected to the capacitors on a group basis.

16. A semiconductor device according to claim 15, wherein the first terminal of the capacitors not connected to said analog signal processing circuit are connected to respective input terminals through a switch.

17. A semiconductor device according to claim 15, wherein said semiconductor device includes the plurality of analog signal processing circuits, and each of the analog signal processing circuits is connected to the first terminal of the capacitors connected to said analog signal processing circuit through a switch.

18. A semiconductor device according to claim 17, wherein the first terminal of the capacitors not connected to said analog signal processing circuit are connected to respective input terminals through a switch.

19. A semiconductor device according to claim 5, wherein said semiconductor device includes the at least one analog signal processing circuit.

20. A semiconductor device according to claim 5, wherein the first terminal of the capacitors connected to said analog signal processing circuit connected to respective input terminals through a switch.

21. A semiconductor device according to claim 20, wherein the first terminal of at least one of said capacitors is connected to the analog signal processing circuit through the switch, and the input terminal is connected to the first terminal of another capacitor through another switch.

22. A semiconductor device according to claim 21, wherein each switch is provided for a respective one of the input terminals, corresponding to a respective analog signal processing circuit.

23. A semiconductor device according to claim 5, wherein the first terminals of the capacitors connected to said analog signal processing circuit are respectively connected through a switch to the analog signal processing circuit corresponding to the switch.

24. A semiconductor device according to claim 5, wherein said plurality of capacitors have capacitors connected commonly to the second terminal thereof.

25. A semiconductor device according to claim 24, wherein said capacitors include a parasitic capacity of the wiring.

26. A semiconductor device comprising:

a plurality of input terminals;

first and second capacitors having first terminals and second terminals corresponding to the first terminals, wherein said capacitors are divided into at least two groups, each of said groups including at least one first capacitor and at least one second capacitor, and in each of said groups, the first terminals of said first and second capacitors are connected to the plurality of input terminals, and said second terminals of said first and second capacitors are directly connected commonly to a common sense amplifier;

switch means for resetting to a desired voltage a terminal of said sense amplifier connected to the second terminals of said first and second capacitors, said sense amplifier being provided correspondingly to each of said groups; and analog signal processing circuit provided, in each of said groups, between at least one of said plural input terminals and the first terminal of said first capacitor corresponding to said at least one of said plural input terminals.

27. A semiconductor device according to claim 26, wherein the first capacitors of at least two groups are connected to common analog signal processing circuit.

28. A semiconductor device according to claim 26, wherein, in each of the groups, at least one of the first terminals of said second capacitors not connected to said analog signal processing circuit is connected to a common input terminal.

* * * * *